(12) United States Patent
Hsieh et al.

(10) Patent No.: US 12,500,134 B2
(45) Date of Patent: Dec. 16, 2025

(54) PACKAGE ASSEMBLY INCLUDING A PACKAGE LID HAVING A STEP REGION AND METHOD OF MAKING THE SAME

(71) Applicant: Taiwan Semiconductor Manufacturing Company Limited, Hsinchu (TW)

(72) Inventors: Ping-Yin Hsieh, Hsinchu (TW); Yu-Hsun Wang, Hsinchu (TW); Li-Hui Cheng, New Taipei (TW); Szu-Wei Lu, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 736 days.

(21) Appl. No.: 17/706,700

(22) Filed: Mar. 29, 2022

(65) Prior Publication Data

US 2023/0011493 A1     Jan. 12, 2023

Related U.S. Application Data

(60) Provisional application No. 63/219,841, filed on Jul. 9, 2021.

(51) Int. Cl.
| | | |
|---|---|---|
| *H01L 23/04* | (2006.01) | |
| *H01L 21/48* | (2006.01) | |
| *H01L 23/31* | (2006.01) | |
| *H01L 23/373* | (2006.01) | |
| *H01L 23/498* | (2006.01) | |

(52) U.S. Cl.
CPC ........ *H01L 23/373* (2013.01); *H01L 21/4803* (2013.01); *H01L 23/04* (2013.01); *H01L 23/3107* (2013.01); *H01L 23/49822* (2013.01)

(58) Field of Classification Search
CPC ... H01L 23/373; H01L 21/4803; H01L 23/04; H01L 23/3107; H01L 23/49822; H01L 23/10; H01L 23/49816; H01L 23/3675; H01L 23/5384; H01L 23/42
See application file for complete search history.

(56) References Cited

U.S. PATENT DOCUMENTS

| | | | | |
|---|---|---|---|---|
| 2008/0291634 | A1* | 11/2008 | Weiser | H01L 23/42 361/708 |
| 2013/0270691 | A1* | 10/2013 | Mallik | H01L 23/49833 257/713 |
| 2014/0134800 | A1* | 5/2014 | Kelly | H01L 23/3675 438/118 |
| 2016/0247742 | A1* | 8/2016 | Vadhavkar | H01L 25/0657 |
| 2021/0080500 | A1* | 3/2021 | Braunisch | H01L 23/5384 |

* cited by examiner

*Primary Examiner* — Jacob Y Choi
*Assistant Examiner* — Grace Cha
(74) *Attorney, Agent, or Firm* — The Marbury Law Group, PLLC

(57) ABSTRACT

A package assembly includes an interposer module on a package substrate, a thermal interface material (TIM) film on the interposer module, and a package lid that includes a plate portion on the TIM film and a step region projecting away from the plate portion and located over the TIM film and over an edge region of the interposer module.

20 Claims, 19 Drawing Sheets

PACKAGE ASSEMBLY INCLUDING A PACKAGE LID HAVING A STEP REGION AND METHOD OF MAKING THE SAME

RELATED APPLICATIONS

This application claims the benefit of priority from U.S. Provisional Application No. 63/219,841, entitled "Step Lid for 3DIC Package" filed on Jul. 9, 2021, the entire contents of which are incorporated herein by reference for all purposes.

BACKGROUND

A package assembly may include one or more semiconductor dies that may be stacked or mounted on an interposer. Operation of the semiconductor dies may generate a large amount of heat that needs to be dissipated. Designing for heat dissipation in the package assembly may be challenging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
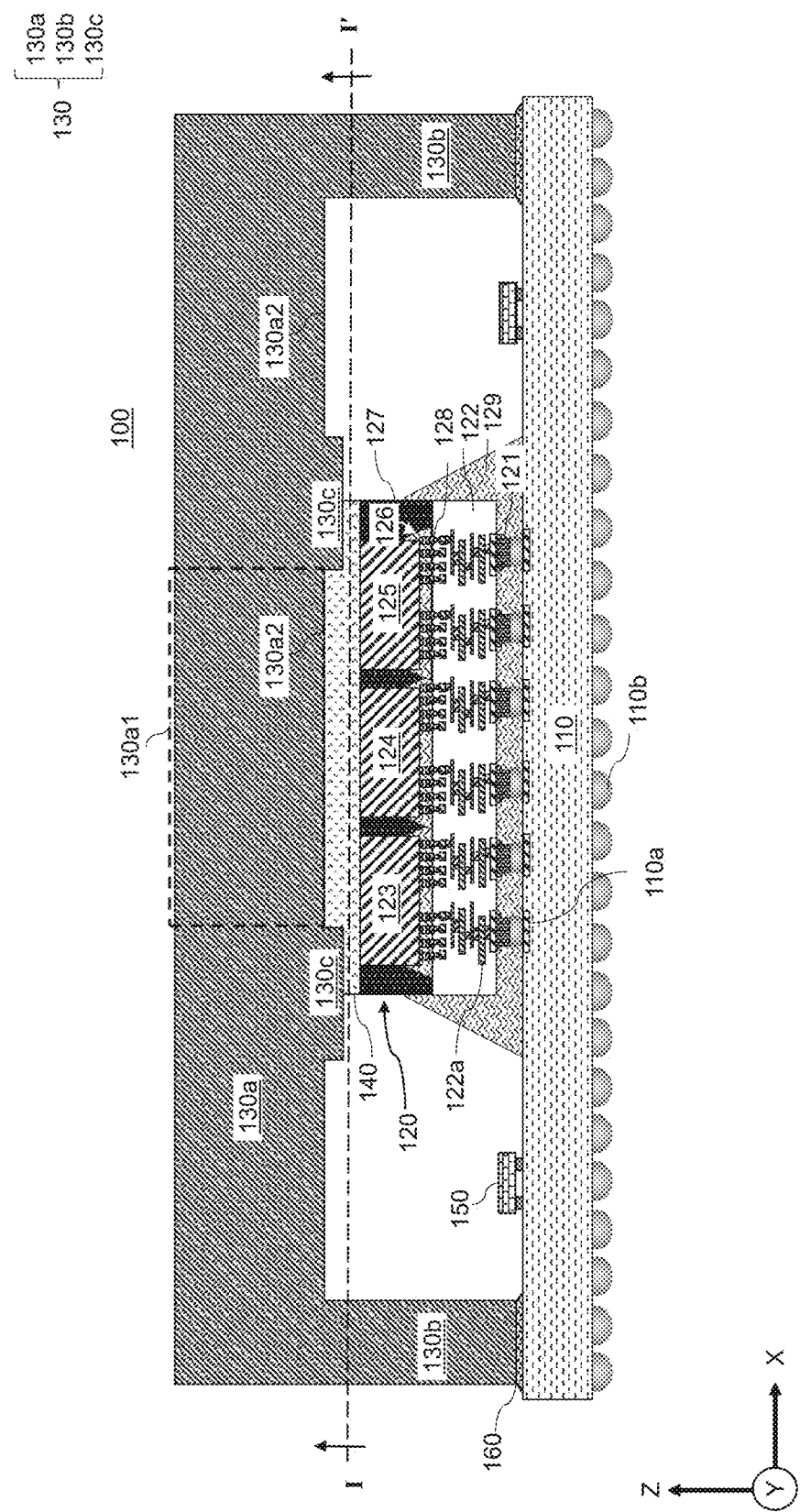
FIG. 1A illustrates a vertical cross-sectional view of the package assembly according to one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Multiple chip integration for high-performance computing (HPC) may require an increase in the size of package assemblies. A large package assembly (e.g., 75 mm×75 mm, 78 mm×70 mm, 85 mm×85 mm, etc.) may cause high coefficient of performance (COP) due to a mismatch in the coefficients of thermal expansion (CTE) within the package assembly. For example, a real-time (RT) system on chip (SOC) die on a 78 mm×70 mm package substrate may have a COP of about 351 μm.

A thermal interface material (TIM) film may be included in the package assembly to help dissipate heat. A graphite TIM film or carbon nanotube (CNT) TIM film may be used as next generation products due to their high thermal conductivity.

However, current package assemblies typically include a flat package lid that may exert a uniform force on the die (e.g., SoC die) surface such that the TIM film at an edge region of the die does not attach well due to COP. In particular, a large package assembly may have poor TIM film coverage on the edge region of a die (e.g., system on chip (SoC) die) due to high COP. That is, an edge region of a die in a large package assembly could easily delaminate due to the high COP. Thus, a problem in a typical package assembly is that as the size of the package assembly is increased, the COP of package assembly may also increase which may make it difficult for the TIM film to cover an edge region of a die (e.g., SoC die) in the package assembly.

An embodiment of the present invention may include a stepped packaged lid (e.g., an upper step lid or lower step lid) that may enhance the TIM film coverage at the edge region of the die (e.g., SoC die). The package lid may be composed of metal, ceramic or plastic, and may help to improve the poor coverage at the edge region of dies due to high COP in current package assemblies and in particular, large package assemblies. The package lid may include an innovative step region (e.g., step structure) that may be provided at an upper surface and/or bottom surface of the package lid. The step region may cover the edge region of the die (e.g., SOC die) and may enhance the edge coverage of a TIM film and, thereby, help to achieve a more uniform thermal dissipation in the package assembly.

In embodiments in which the step region is formed on the top of the package lid, the height of the step region may be greater than or equal to zero, and the width of the step region may be less than one-half the outer width of the package lid. In embodiments in which the step region is formed on the bottom of the package lid, the height of the step region may be greater than or equal to zero, and the width of the step region may be less than one-half the inner width of the package lid.

An embodiment of the present invention may be assembled, for example, by flip chip bonding (FCB) of a die or interposer module on a package substrate, applying a C4 underfill material and curing the underfill material. The TIM film may be attached to an upper surface of the die or interposer module. An adhesive may then be dispensed on the package substrate, and the package lid maybe attached to the package substrate. The package lid may then be heat clamped to the package substrate (e.g., using a heat clamp module) and then the adhesive may be cured. Backside surface mount technology (SMT) & ball grid array (BGA) ball mounts may be applied to a board side of the package substrate.

Figure 1B:
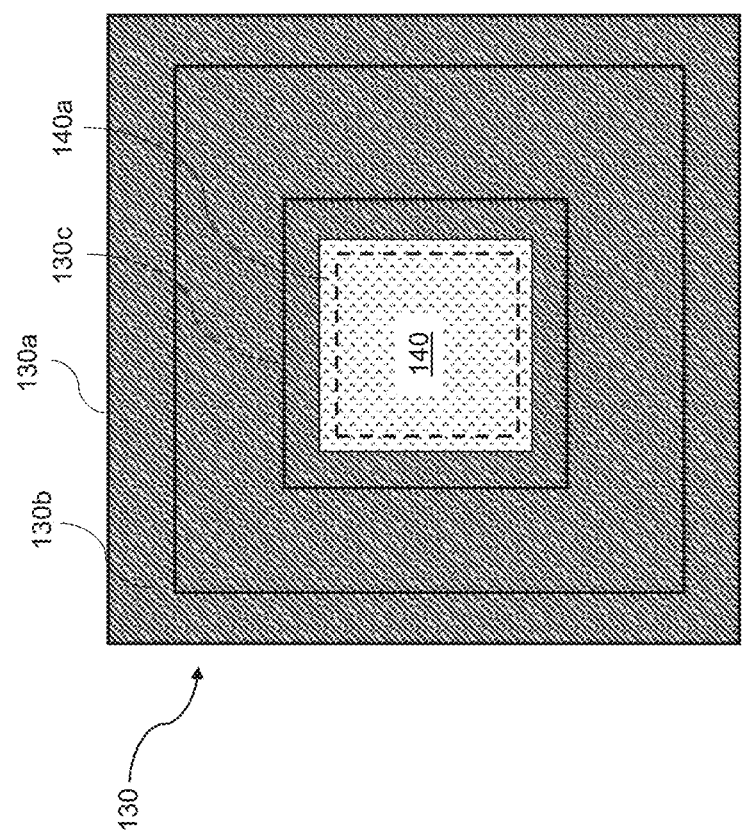
FIG. 1B illustrates a horizontal cross-sectional view of the package assembly along the line I-I' in FIG. 1A according to one or more embodiments.
Figure 1C:
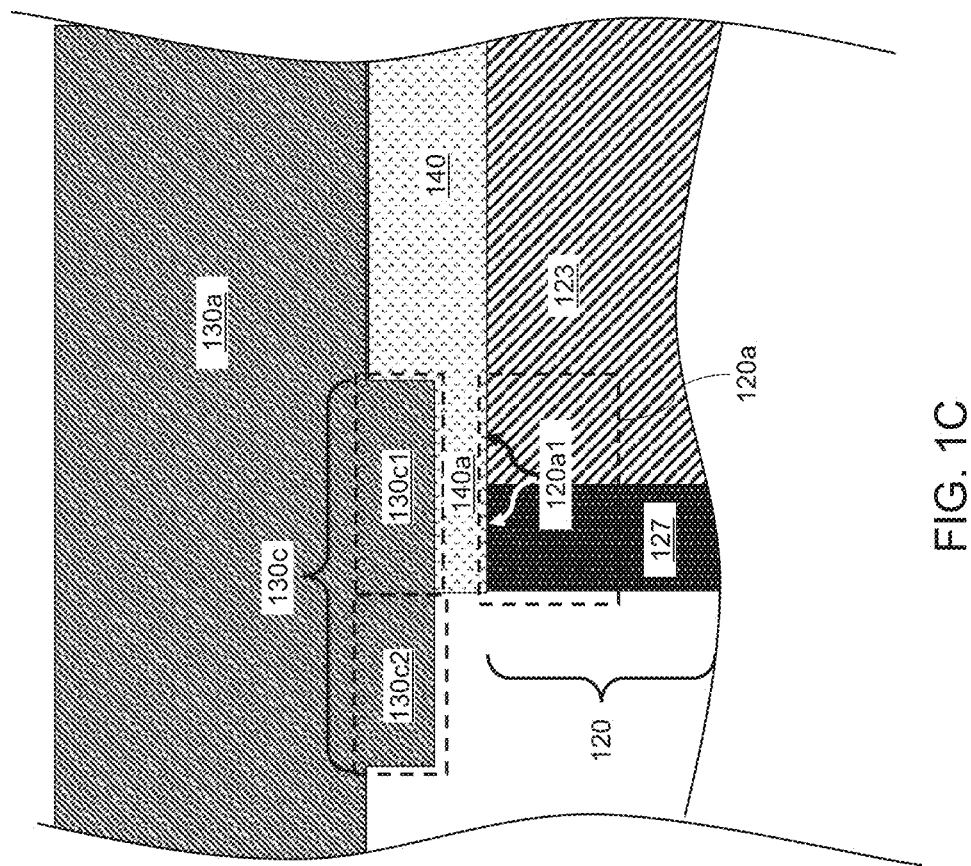
FIG. 1C illustrates a vertical cross-sectional view of a detailed vertical cross-sectional view of the bottom step region and the TIM film according to one or more embodiments.

FIGS. 1A-1C provide different views of a package assembly 100 (e.g., organic/silicon interposer package) according to one or more embodiments. FIG. 1A illustrates a vertical cross-sectional view of the package assembly according to one or more embodiments. FIG. 1B illustrates a horizontal cross-sectional view of the package assembly 100 along the line I-I' in FIG. 1A according to one or more embodiments.

The package assembly 100 may include a package substrate 110, an interposer module 120 mounted on the package substrate 110, and a package lid 130 on the interposer module 120 and attached to the package substrate 110. The package assembly 100 may also include a TIM film 140 formed on the on the interposer module 120. The TIM film 140 may include, for example, a graphite TIM film and a carbon nanotube TIM film. Other types of TIM films are within the contemplated scope of this disclosure.

The package substrate 110 may include, for example, a core substrate (e.g., polymer substrate), an upper insulating layer (e.g., chip-side insulating layer) formed on the core substrate, and a lower insulating layer (e.g., board-side insulating layer) formed on the core substrate opposite the upper insulating layer. The package substrate 110 may also include metal interconnects and through vias to provide an electrical connection of the package substrate 110.

The package substrate 110 may also include metal bonding pads 110a formed on the one side of the package substrate 110 (e.g., a chip-side of the package substrate), for providing an electrical connection to a device (e.g., interposer module, semiconductor die, etc.) that is mounted on the package substrate 110. A ball-grid array (BGA) including a plurality of solder balls 110b may be formed on a side of the package substrate 110 (e.g., board-side of the package substrate 110) opposite to the metal bonding pads 110a. The solder balls 110b may allow the package assembly 100 to be securely mounted on a substrate such as a printed circuit board (PCB) and electrically coupled to the substrate. The solder balls 110b may be electrically connected to the metal bonding pads 110a by the metal interconnects and through vias in the package substrate 110.

The interposer module 120 may be mounted by C4 bumps 121 on the metal bonding pads 110a in the package substrate 110. The interposer module 120 may include an interposer dielectric layer 122 that may include metal interconnects 122a connected to the C4 bumps 121. The interposer module 120 may also include a first semiconductor die 123, second semiconductor die 124 and a third semiconductor die 125 that may all be mounted on the interposer dielectric layer 122.

The first semiconductor die 123, second semiconductor die 124 and third semiconductor die 125 may be mounted on the interposer dielectric layer 122 by micro-bumps 128 that may be electrically connected to the metal interconnects 122a. A package underfill layer 129 may be formed under and around the interposer module 120 and the C4 bumps 121 so as to fix the interposer module 120 to the package substrate 110. The package underfill layer 129 may be formed of an epoxy-based polymeric material.

Each of the first semiconductor die 123, second semiconductor die 124 and third semiconductor die 125 may include, for example, a semiconductor die, a system on chip (SOC) die, a system on integrated chips (SoIC) die, and a high-bandwidth memory (HBM) die. In particular, the interposer module 120 may include a high-performance computing (HPC) application and may include, for example, an integrated graphics processing unit (GPU), application specific integrated circuit (ASIC), field-programmable gate array (FPGA), and HBM by chip on wafer on substrate (CoWoS) technology or integrated fan-out on substrate (INFO-oS) technology.

An interposer underfill layer 126 may be formed around the micro-bumps 128 and between the first semiconductor die 123 and the interposer dielectric layer 122, between the second semiconductor die 124 and the interposer dielectric layer 122, and between the third semiconductor die 125 and the interposer dielectric layer 122. The interposer underfill layer 126 may be formed as three separate portions under the first semiconductor die 123, second semiconductor die 124 and third semiconductor die 125, respectively, as illustrated in FIG. 1A. Alternatively, the interposer underfill layer 126 may be formed continuously under all of the first semiconductor die 123, second semiconductor die 124 and third semiconductor die 125. The interposer underfill layer 126 may also be formed between first semiconductor die 123 and the second semiconductor die 124, and between the second semiconductor die 124 and the third semiconductor die 125. The interposer underfill layer 126 may also be formed of an epoxy-based polymeric material.

A molding material layer 127 may be formed over the first semiconductor die 123, the second semiconductor die 124, the third semiconductor die 125, the interposer underfill layer 126 and the interposer dielectric layer 122. The molding material layer 127 may be formed of an epoxy molding compound (EMC).

The TIM film 140 may be formed on the interposer module 120 to dissipate of heat generated during operation of the package assembly 100 (e.g., operation of first semiconductor die 123, second semiconductor die 124, and third semiconductor die). The TIM film 140 may be attached to the interposer module 120, for example, by a thermally conductive adhesive. In particular, the TIM film 140 may contact an upper surface of first semiconductor die 123, an upper surface of second semiconductor die 124, an upper surface of the third semiconductor die 125, and an upper surface of the molding material layer 127. The TIM film 140 may have a low bulk thermal impedance and high thermal conductivity. The bond-line-thickness (BLT) (e.g., a distance between the package lid 130 and the interposer module 120) may be less than about 100 μm, although greater or lesser distances may be used.

The package assembly 100 may also include a stiffener ring 150 that may be fixed to the package substrate 110 by an adhesive (e.g., a silicone adhesive or an epoxy adhesive). The stiffener ring 150 may be formed of a metal such as copper with a nickel coating, or an aluminum alloy. The stiffener ring 150 may be formed on the package substrate 110 so as to encircle the interposer module 120. The stiffener ring 150 may provide rigidity to the package substrate 110.

The package lid 130 may be on the TIM film 140 and may provide a cover for the interposer module 120. The package lid 130 may contact at least a portion of the TIM film 140. In one or more embodiments, the package lid 130 may directly contact an entire upper surface of the TIM film 140. The package lid 130 may be formed, for example, of metal, ceramic or polymer material. The package lid 130 may include a plate portion 130a (e.g., a main body) that may be substantially parallel to an upper surface of the package substrate 110. The plate portion 130a may extend, for example, in an x-y plane in FIG. 1A. The package lid may also include a sidewall portion 130b that may connect the plate portion 130a to the package substrate 110. The sidewall portion 130b may extend in a substantially perpendicular direction from the plate portion 130a. The sidewall portion 130b may be connected to the package substrate 110 by an adhesive 160. The adhesive 160 may include, for example, epoxy adhesive or silicone adhesive. Other adhesives are within the contemplated scope of this disclosure. The plate portion 130a may include a central region 130a1 that is formed over a central portion of the interposer module 120. A bottom surface 130a2 of the plate portion 130a may extend across most of the plate portion 130a between the sidewall portions 130b and contact the TIM film 140.

The package lid 130 may also include a bottom step region 130c that may project from the plate portion 130a and contact the TIM film 140. In particular, the bottom step region 130c may project from the bottom surface 130a2 of the plate portion 130a. In at least one embodiment, the bottom step region 130c may extend in a substantially perpendicular direction from the plate portion 130a. In particular, a sidewall of the bottom step region 130c may extend in a substantially perpendicular direction from the plate portion 130a. The bottom step region 130c may be formed around the central region 130a1 of the plate portion 130a. The bottom step region 130c may be formed in the plate portion 130a of the package lid 130, for example, by milling using a computer numerical control (CNC) milling machine, or by molding or stamping the plate portion 130a of the package lid 130 to include the bottom step region 130c.

Alternatively, the bottom step region 130c may be formed separately from the plate portion 130a, and affixed to the plate portion 130a. For example, the bottom step region 130c may be bonded by an adhesive to the bottom surface 130a2 of the plate portion 130a. The bottom step region 130c may also be composed of a material (e.g., polymer, metal, ceramic, etc.) that is different from the material of the plate portion 130a. In particular, the bottom step region 130c may be composed of a material having a density that is greater than a density of the material of the plate portion 130a. For example, the bottom step region 130c may be composed of a metal (e.g., aluminum, steel, etc.) and the plate portion 130a may be composed of a ceramic material.

The TIM film 140 may be compressed between the bottom step region 130c and an upper surface of the interposer module 120. The TIM film 140 may also contact the bottom surface 130a2 in the central region 130a1 of the plate portion 130a, and may be compressed between the bottom surface 130a2 and the upper surface of the interposer module 120. The degree of compression on the TIM film 140 between the bottom step region 130c and the interposer module 120 may be greater than the degree of compression on the TIM film 140 by the bottom surface 130a2 of the plate portion 130a and the interposer module 120. Thus, as illustrated in FIG. 1A, a compressed thickness of the TIM film 140 between the bottom step region 130c and the interposer module 120 may be less than the compressed thickness of the TIM film 140 between the bottom surface 130a2 of the plate portion 130a in the central region 130a1 and the interposer module 120. In at least one embodiment, the compressed thickness of the TIM film 140 between the bottom step region 130c and the interposer module 120 may be in a range from 70% to 90% of the compressed thickness of the TIM film 140 between the bottom surface 130a2 and the interposer module 120. As a result, the TIM film 140 may be formed between opposing sides of the bottom step region 130c, as illustrated in FIG. 1A.

As illustrated in FIG. 1B, the package lid 130 may have a square shape or rectangle shape in the horizontal cross-sectional view. Other suitable shapes of the package lid 130 may be within the contemplated scope of disclosure. The sidewall portion 130b may be formed around the entire perimeter of the plate portion 130a of the package lid 130. The bottom step region 130c may be formed in the plate portion 130a around an entire perimeter of the TIM film 140. The TIM film 140 may also have a shape that corresponds to (e.g., is substantially the same as) the shape of the bottom step region 130c (i.e., a square shape as shown in FIG. 1B) and may or may not correspond to a shape of the package lid 130. The TIM film 140 may also include a TIM film edge region 140a that may be formed around an entire perimeter of the TIM film 140.

FIG. 1C provides a detailed vertical cross-sectional view of the bottom step region 130c and the TIM film 140 according to one or more embodiments. As illustrated in FIG. 1C, the interposer module 120 may include an interposer module edge region 120a that may be formed at an outermost (e.g., in the x-direction) sidewall of the interposer module 120 and may include a portion of the molding material layer 127 and a portion of the first semiconductor die 123.

The bottom step region 130c may have a rectangular cross-section, although other cross-sectional shapes may be within the contemplated scope of this disclosure. The bottom step region 130c may have a contact surface that contacts the TIM film 140. The contact surface may include a uniform surface (e.g., a smooth surface) or may include a roughened surface that may increase a contact surface area of the bottom step region 130c. In at least one embodiment, the contact surface of the bottom step region 130c may include a ribbed surface, convex/concave surface or undulating surface.

Further, the bottom step region 130c may have a bottom surface facing the interposer module 120 that is substantially coplanar with the bottom surface 130a2 of the plate portion 130a. However, it is possible that the bottom surface of the bottom step region 130c may not be coplanar with the bottom surface 130a2 of the plate portion 130a, but instead may be slanted downward away from the central region 130a1 of the plate portion 130a, or slanted downward toward the central region 130a1 of the plate portion 130a.

As illustrated in FIG. 1C, the bottom step region 130c may include a bottom step region covering portion 130c1 that may cover the interposer module edge region 120a, and a bottom step region non-covering portion 130c2 that may not cover the interposer module edge region 120a. That is, the bottom step region 130c may straddle an outermost sidewall of the interposer module 120. In some embodiments, the bottom step region covering portion 130c1 may have substantially the same size and shape as the bottom step region non-covering portion 130c2. In other embodiments, the bottom step region covering portion 130c1 and the bottom step region non-covering portion 130c2 may have a substantially different size and/or shape. In at least one embodiment, the contact surface of the bottom step region covering portion 130c1 may have a roughness that is greater than a roughness of the bottom step region non-covering portion 130c2. In at least one embodiment, the bottom step region covering portion 130c1 may having a width in the x-direction that is at least 60% of the total width of the bottom step region 130c. In at least one embodiment, a thickness in the z-direction of the bottom step region covering portion 130c1 may be less than a thickness of the bottom step region non-covering portion 130c2. In at least one embodiment, a thickness in the z-direction of the bottom step region covering portion 130c1 may be in a range from 10% to 50% of a thickness of the bottom step region non-covering portion 130c2.

The interposer module edge region 120a may include an upper surface 120a1 that may include an upper surface of the molding material layer 127 and an upper surface of the first semiconductor die 123. The TIM film edge region 140a may be formed between the bottom step region covering portion 130c1 and the upper surface 120a1 of the interposer module edge region 120a. In at least one embodiment, a length of the molding material layer 127 (in the x-direction of FIG. 1C) may include at least 50% of the total length of the TIM film edge region 140a.

As illustrated in FIG. 1C, the TIM film edge region 140a may be compressed between the bottom step region covering portion 130c1 and the upper surface 120a1 of the interposer module edge region 120a. Although it is not illustrated in FIG. 1C, the TIM film edge region 140a may be compressed between the bottom step region covering portion 130c1 and the upper surface 120a1 of the interposer module edge region 120a around the entire perimeter of the TIM film 140. In at least one embodiment, the TIM film edge region 140a may be compressed between the bottom step region covering portion 130c1 and the upper surface 120a1 of the interposer module edge region 120a around a portion (e.g., between 80% and 100%) of the perimeter of the TIM film 140.

Figure 1D:
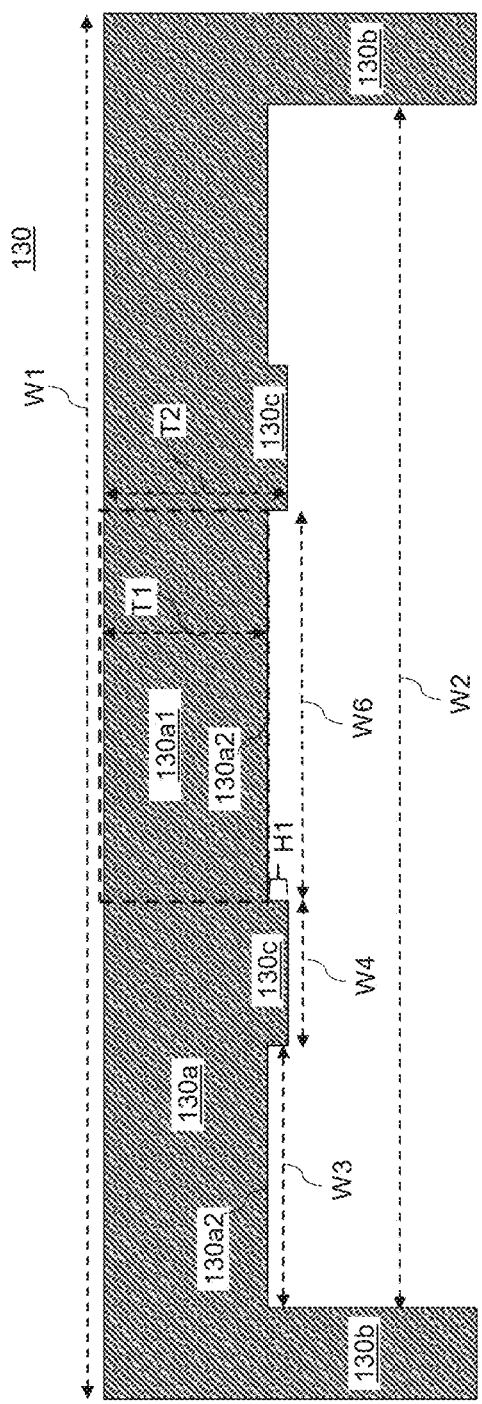
FIG. 1D provides a detailed illustration of the package lid according to one or more embodiments.

FIG. 1D provides a detailed illustration of the package lid 130 according to one or more embodiments. As illustrated in FIG. 1D, the package lid 130 may include an outer width W1 that extends across the plate portion 130a to an outermost edge of the sidewall portion 130b. The package lid 130 may also include an inner width W2 that may extend between the innermost edge of the sidewall portion 130b, and a width W3 that extends from the innermost edge of the sidewall portion 130b to the bottom step region 130c. The bottom step region 130c may have a height H1 that may be greater than or equal to zero (H1≥0) and a width W4 that may be less than one-half of the W2 (W4<0.5W2). In one or more embodiments, the height H1 of the bottom step region 130c may be less than a thickness of the TIM film 140. More particularly, the height H1 of the bottom step region 130c may be less than 0.3 times the thickness of the TIM film 140.

The bottom step region 130c may project from a bottom surface 130a2 of the plate portion 130a so that a thickness T1 (e.g., in the z-direction) of the plate portion 130a (e.g., at the central region 130a1) may be less than a thickness T2 (e.g., in the z-direction) of the plate portion 130a at the bottom step region 130c. A width W6 of the central region 130a1 may be equal to the inner width W2 less twice the width of the bottom step region 130c and twice the width W3 (W6=W2−(2W4+2W3). A center of the TIM film 140 in the x-direction may be aligned with a center of the central region 130a1 of the plate portion 130a. Thus, the width W6 of the central region 130a1 may be less than a width of the TIM film 140 so that at least a portion of the bottom step region 130c (e.g., the bottom step region covering portion 130c1) may cover the TIM film edge region 140a. In addition, a same size portion of the bottom step region 130c may cover the TIM film edge region 140a on opposing sides of the TIM film 140.

Figure 2A:
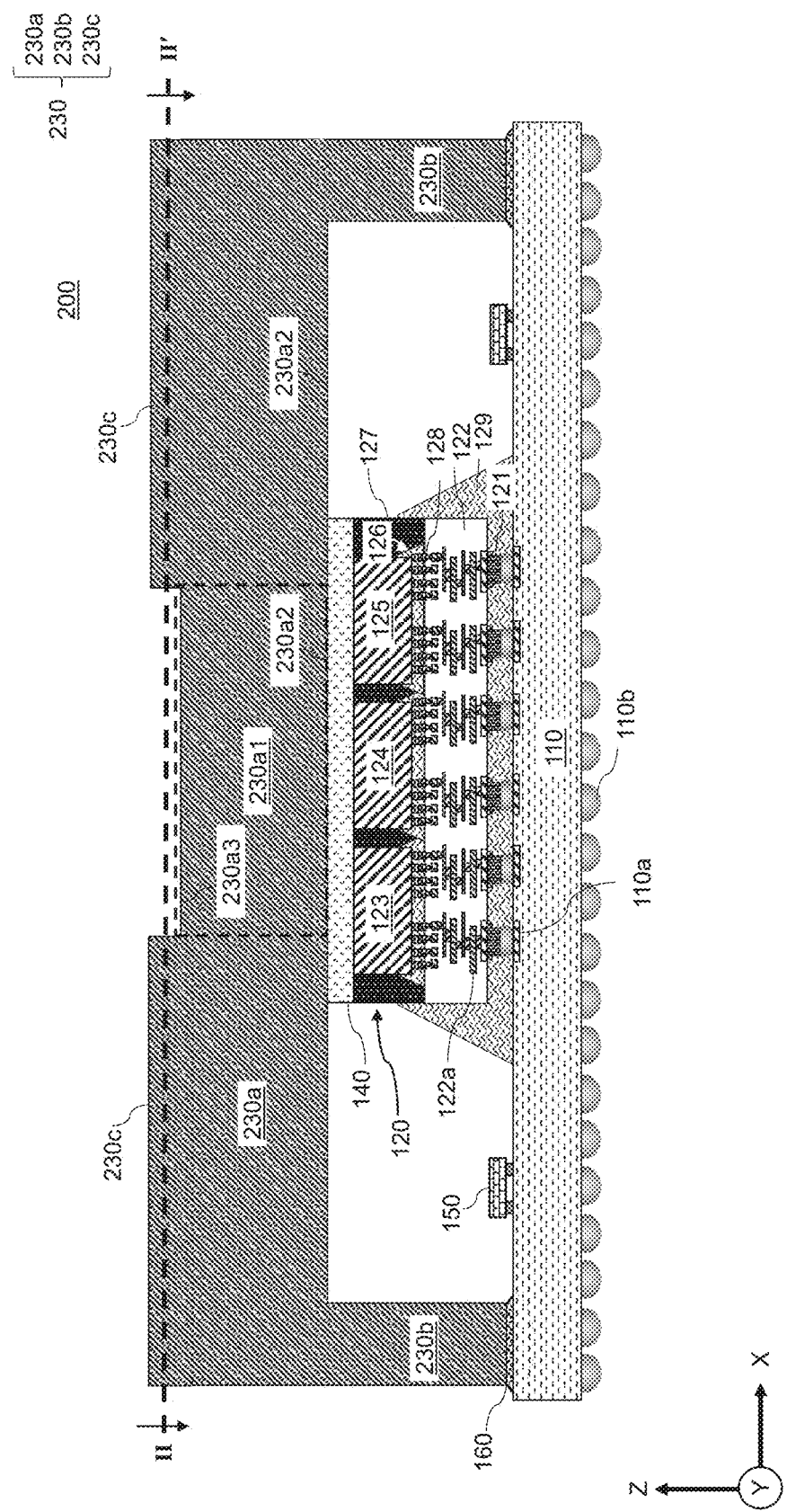
FIG. 2A illustrates a vertical cross-sectional view of the package assembly according to one or more embodiments.
Figure 2B:
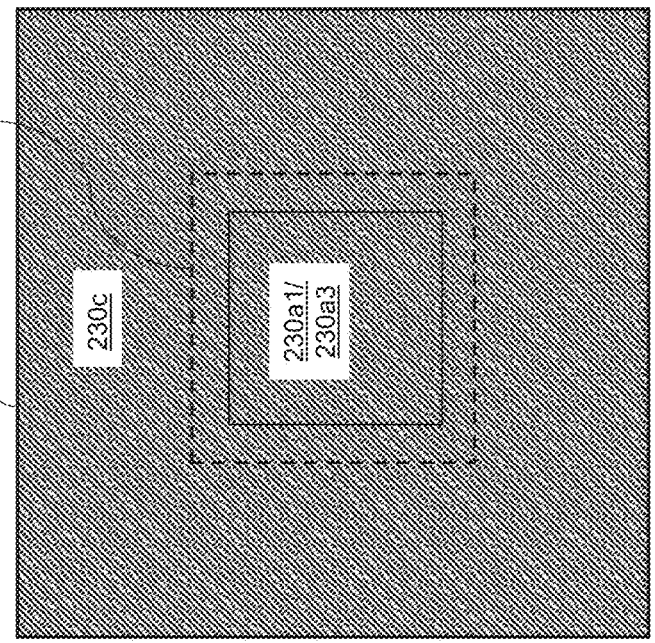
FIG. 2B illustrates a horizontal cross-sectional view of the package assembly along the line II-II' in FIG. 2A according to one or more embodiments.
Figure 2C:
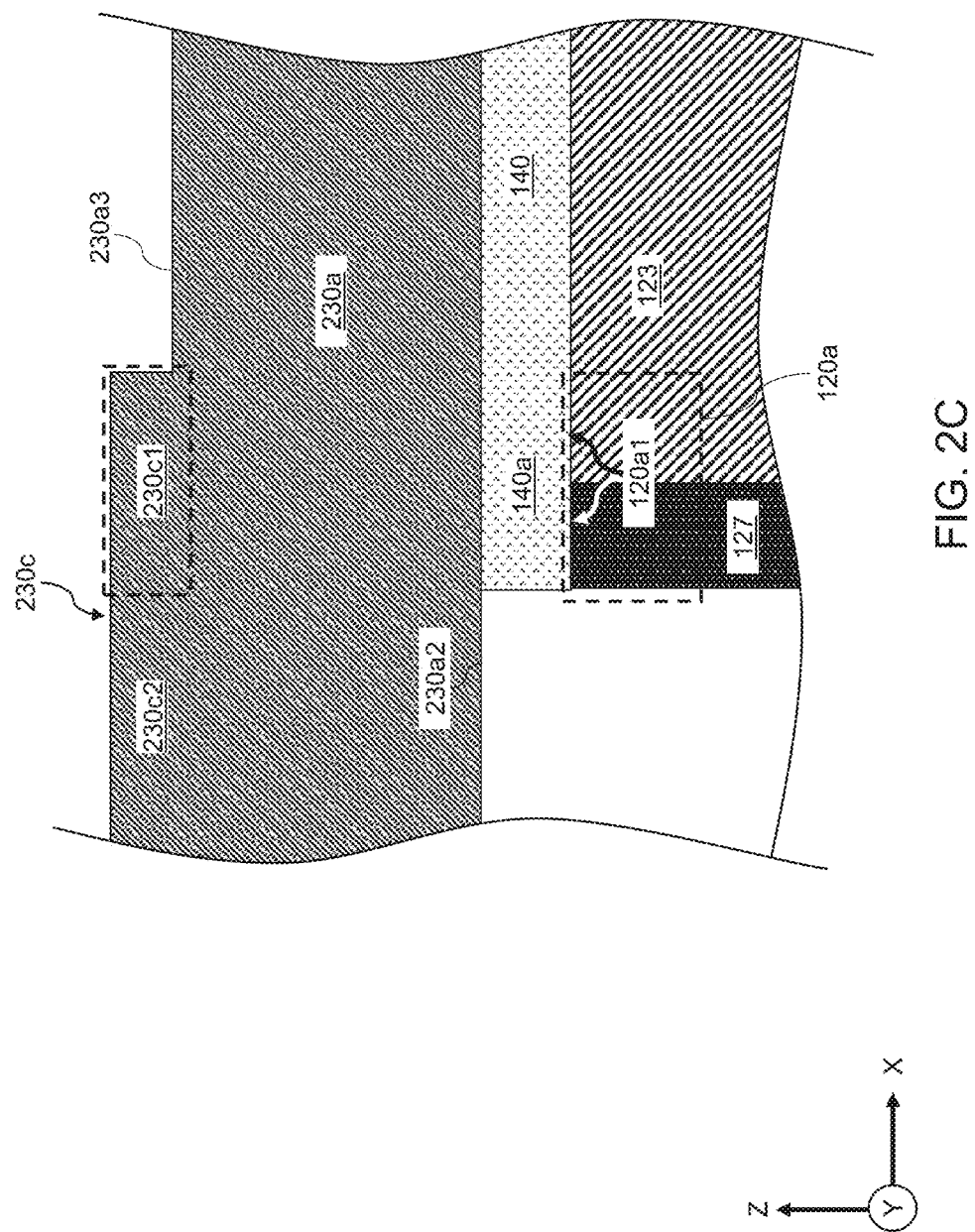
FIG. 2C provides a detailed vertical cross-sectional view of the upper step region and the TIM film according to one or more embodiments

FIGS. 2A-2C illustrate a package assembly 200 (e.g., organic/silicon interposer package) according to one or more embodiments. FIG. 2A illustrates a vertical cross-sectional view of the package assembly 200 according to one or more embodiments. FIG. 2B illustrates a horizontal cross-sectional view of the package assembly 200 along the line II-II' in FIG. 2A according to one or more embodiments. The package assembly 200 may be substantially similar to the package assembly 100 illustrated in FIGS. 1A-1C, except that package assembly 200 may include package lid 230 instead of package lid 130.

The package assembly 200 may include the package substrate 110, the interposer module 120 mounted on the package substrate 110, and the package lid 230 on the interposer module 120 and attached to the package substrate 110. The package assembly 200 may also include the TIM film 140 formed on the interposer module 120. The package assembly 200 may also include the stiffener ring 150 that may be fixed to the package substrate 110 by an adhesive (e.g., a silicone adhesive or an epoxy adhesive).

As in package assembly 100, the interposer module 120 in package assembly 200 may include the first semiconductor die 123, second semiconductor die 124 and third semiconductor die 125. Each of the first semiconductor die 123, second semiconductor die 124 and third semiconductor die 125 may include, for example, a semiconductor die, a system on chip (SOC) die, a system on integrated chips (SoIC) die, and a high-bandwidth memory (HBM) die. In particular, the interposer module 120 may include a high-performance computing (HPC) application and may include, for example, an integrated graphics processing unit (GPU), application specific integrated circuit (ASIC), field-programmable gate array (FPGA), and HBM by chip on wafer on substrate (CoWoS®) technology or integrated fan-out on substrate (INFO-oS) technology.

The TIM film 140 may contact the upper surface of first semiconductor die 123, the upper surface of second semiconductor die 124, the upper surface of the third semiconductor die 125, and the upper surface of the molding material layer 127. The TIM film 140 may have a low bulk thermal impedance and high thermal conductivity. The bond-line-thickness (BLT) (e.g., a distance between the package lid 230 and the interposer module 120) may be less than about 100 µm, although greater or lesser distances may be used.

The package lid 230 may be on the TIM film 140 and may provide a cover for the interposer module 120. The package lid 230 may contact at least a portion of the TIM film 140. The package lid 230 may be formed, for example, of metal, ceramic or polymer material. The package lid 230 may include a plate portion 230a (e.g., a plate portion), and a sidewall portion 230b that may connect the plate portion 230a to the package substrate 110 by an adhesive 160. The plate portion 230a may include a central region 230a1 that is formed over a central portion of the interposer module 120. A bottom surface 230a2 of the plate portion 230a may extend across the plate portion 230a between the sidewall portions 230b and contact the TIM film 140.

The package lid 230 may also include an upper step region 230c that may project from the plate portion 230a. In particular, the upper step region 230c may project from the upper surface 230a3 of the plate portion 230a. The upper step region 230c may be formed around the central region 230a1 of the plate portion 230a. The upper step region 230c may be formed in the plate portion 230a of the package lid 230, for example, by milling using a computer numerical control (CNC) milling machine, or by molding or stamping the plate portion 230a of the package lid 230 to include the upper step region 230c. Alternatively, the upper step region 230c may be formed separately from the plate portion 230a, and fixed to the plate portion 230a. In this case, the upper step region 230c may be bonded by an adhesive to the upper surface 230a3 of the plate portion 230a. The upper step region 230c may also be composed of a material (e.g., polymer, metal, ceramic, etc.) that is different from the material of the plate portion 230a. In particular, the upper step region 230c may be composed of a material having a density that is greater than a density of the material of the plate portion 230a.

The TIM film 140 may contact the bottom surface 230a2 of the plate portion 230a in the central region 230a1 of the plate portion 230a, and may be compressed between the bottom surface 230a2 in the central region 230a1 and the upper surface of the interposer module 120. The TIM film 140 may also contact the bottom surface 230a2 of the plate portion 230a outside of the central region 230a1, and may be compressed between the bottom surface 230a2 outside of the central region 230a1 and the upper surface of the interposer module 120.

As illustrated in FIG. 2B, the package lid 230 may have a square shape or rectangle shape in the horizontal cross-sectional view. Other suitable shapes of the package lid 230 may be within the contemplated scope of disclosure. The TIM film 140 may include the TIM film edge region 140a that may be formed around an entire perimeter of the TIM film 140. An outline of the TIM film edge region 140a is shown by dotted lines in FIG. 2B to indicate that the TIM film 140 is located beneath the package lid 230. A size of the TIM film 140 may be greater than a size of the central region 230a1 and a size of the upper surface 230a3 of the plate portion 230a, so that the upper step region 230c may cover the TIM film edge region 140a. The upper step region 230c may be formed in the plate portion 230a around an entire perimeter of the TIM film 140. The TIM film 140 may also have a shape that corresponds to (e.g., is substantially the same as) the shape of the upper step region 230c (i.e., a square shape as shown in FIG. 2B) and may or may not correspond to a shape of the package lid 230.

FIG. 2C provides a detailed vertical cross-sectional view of the upper step region 230c and the TIM film 140 according to one or more embodiments. As illustrated in FIG. 2C, the upper step region 230c may project away from upper surface of the plate portion 230a. The upper step region 230c may have a rectangular cross-section, although other cross-sectional shapes may be within the contemplated scope of this disclosure. The upper step region 230c may have an uppermost surface facing away from the interposer module 120 that is substantially coplanar with the upper surface 230a3 of the plate portion 230a. However, it is possible that the uppermost surface of the upper step region 230c may not be coplanar with the upper surface 230a3 of the plate portion 230a, but instead may be slanted downward away from the central region 230a1 of the plate portion 230a, or slanted downward toward the central region 230a1 of the plate portion 230a.

As illustrated in FIG. 2C, the upper step region 230c may include an upper step region covering portion 230c1 that may cover the interposer module edge region 120a (e.g., be substantially aligned with the interposer module edge region 120a in the z-direction), and an upper step region non-covering portion 230c2 that may not cover the interposer module edge region 120a. That is, the upper step region 230c may straddle an outermost sidewall of the interposer module 120. The upper step region covering portion 230c1 may or may not have substantially the same size and shape as the upper step region non-covering portion 230c2. In at least one embodiment, the upper step region covering portion 230c1 may have a width that is less than a width of the upper step region non-covering portion 230c2. In at least one embodiment, the upper step region covering portion 230c1 may have a width that is in a range from 10% to 40% of the width of the upper step region non-covering portion 230c2. In at least one embodiment, a thickness in the z-direction of the upper step region covering portion 230c1 may be greater than a thickness of the upper step region non-covering portion 230c2. In at least one embodiment, a thickness in the z-direction of the upper step region non-covering portion 230c2 may be in a range from 10% to 50% of a thickness of the upper step region covering portion 230c1.

The TIM film edge region 140a may be formed between the upper step region covering portion 230c1 and the upper surface 120a1 of the interposer module edge region 120a. As illustrated in FIG. 1C, the TIM film edge region 140a may be compressed between the upper surface 120a1 of the interposer module edge region 120a, and a portion of bottom surface 230a2 of the plate portion 230a that is beneath the upper step region covering portion 230c1. Although it is not illustrated in FIG. 2C, the TIM film edge region 140a may be compressed between the upper surface 120a1 of the interposer module edge region 120a, and the portion of bottom surface 230a2 of the plate portion 230a that is beneath the upper step region covering portion 230c1, around the entire perimeter of the TIM film 140. In at least one embodiment, the TIM film edge region 140a may be compressed between the upper step region covering portion 230c1 and the upper surface 120a1 of the interposer module edge region 120a around a portion (e.g., between 80% and 100%) of the perimeter of the TIM film 140.

Figure 2D:
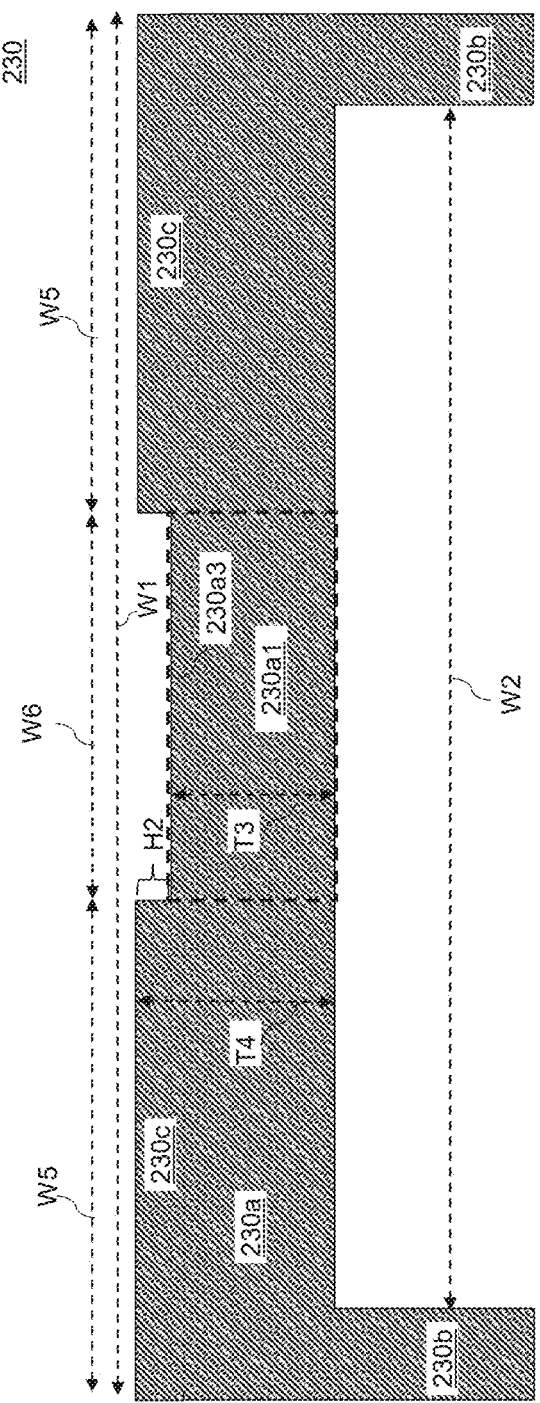
FIG. 2D illustrates a vertical cross-sectional view of a detailed illustration of the package lid according to one or more embodiments.

FIG. 2D provides a detailed illustration of the package lid 230 according to one or more embodiments. As illustrated in FIG. 2D, the package lid 230 may include an outer width W1 that extends across the plate portion 230a to an outermost edge of the sidewall portion 230b. The package lid 230 may also include an inner width W2 that may extend between the innermost edge of the sidewall portion 230b, The upper step region 230c may have a height H2 that may be greater than or equal to zero (H2≥0) and a width W5 that may be less than one-half of the outer width W1 (W5<0.5W1). The upper step region 230c may project from the upper surface 230a3 of the plate portion 230a, so that a thickness T3 (e.g., in the z-direction) of the plate portion 230a (e.g., at the central region 230a1) may be less than a thickness T4 (e.g., in the z-direction) of the plate portion 230a at the upper step region 230c. The increased thickness provided by the upper step region 230c may provide an increased rigidity to the package lid 230, and may allow for a greater force to be applied to the package lid 230 during assembly of the package assembly 200, and for a greater compression force to be applied by the package lid 230 to the TIM film edge region 140a.

A width W6 of the central region 230a1 may be equal to the outer width W1 less twice the width W5 of the upper step region 230c (W6=W1−2W5). A center of the TIM film 140 in the x-direction may be aligned with a center of the central region 230a1 of the plate portion 130a. Thus, the width W6 of the central region 230a1 may be less than a width of the TIM film 140 so that at least a portion of the upper step region 230c (e.g., the upper step region covering portion 230c1) may cover the TIM film edge region 140a.

Figure 3A:
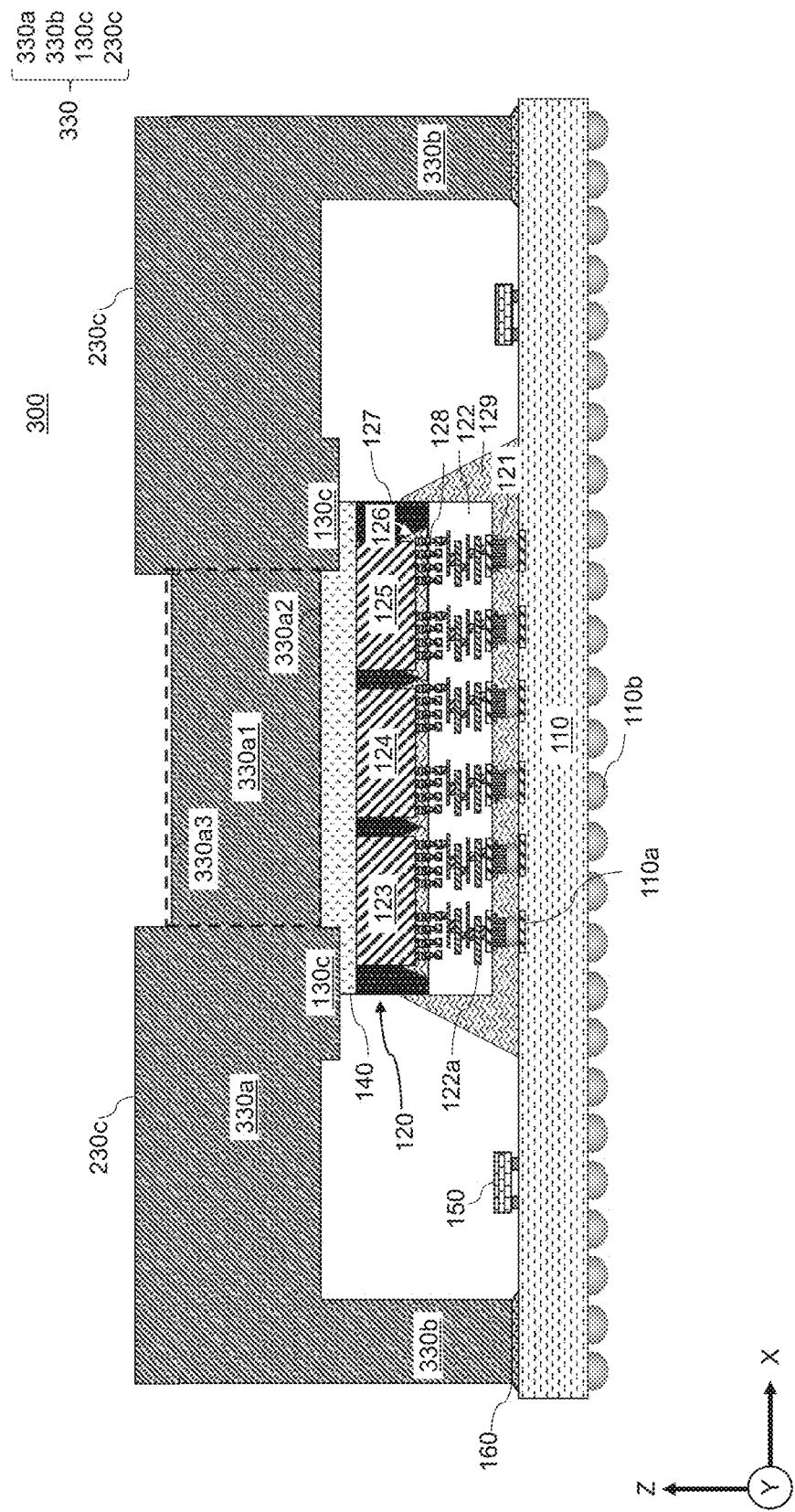
FIG. 3A illustrates a vertical cross-sectional view of the package assembly according to one or more embodiments.

FIG. 3A illustrates a vertical cross-sectional view of the package assembly 300 according to one or more embodiments. The package assembly 300 may be substantially similar to the package assembly 100 illustrated in FIGS. 1A-1C, and substantially similar to the package assembly 200 illustrated in FIGS. 2A-2C, except that package assembly 300 includes package lid 330 instead of package lid 130 or package lid 230.

The package assembly 300 may include the package substrate 110, the interposer module 120 mounted on the package substrate 110, and the package lid 330 on the interposer module 120 and attached to the package substrate 110. The package assembly 300 may also include the TIM film 140 formed on the interposer module 120. The package assembly 300 may also include the stiffener ring 150 that may be fixed to the package substrate 110 by an adhesive (e.g., a silicone adhesive or an epoxy adhesive).

As in package assembly 100 and the package assembly 200, the interposer module 120 in package assembly 300 may include the first semiconductor die 123, second semiconductor die 124 and third semiconductor die 125. Each of the first semiconductor die 123, second semiconductor die 124 and third semiconductor die 125 may include, for example, a semiconductor die, a system on chip (SOC) die, a system on integrated chips (SoIC) die, and a high-bandwidth memory (HBM) die. In particular, the interposer module 120 may include a high-performance computing (HPC) application and may include, for example, an integrated graphics processing unit (GPU), application specific integrated circuit (ASIC), field-programmable gate array (FPGA), and HBM by chip on wafer on substrate (CoWoS) technology or integrated fan-out on substrate (INFO-oS) technology.

The TIM film 140 may contact the upper surface of first semiconductor die 123, the upper surface of second semiconductor die 124, the upper surface of the third semiconductor die 125, and the upper surface of the molding material layer 127. The TIM film 140 may have a low bulk thermal impedance and high thermal conductivity. The bond-line-thickness (BLT) (e.g., a distance between the package lid 330 and the interposer module 120) may be less than about 100 μm, although greater or lesser distances may be used.

The package lid 330 may be on the TIM film 140 and may provide a cover for the interposer module 120. The package lid 330 may contact at least a portion of the TIM film 140. In one or more embodiments, the package lid 330 may directly contact an entire upper surface of the TIM film 140. The package lid 330 may be formed, for example, of metal, ceramic or polymer material. The package lid 330 may include a plate portion 330a (e.g., a plate portion), and a sidewall portion 330b that may connect the plate portion 330a to the package substrate 110 by an adhesive 160. The plate portion 330a may include a central region 330a1 that is formed over a central portion of the interposer module 120. A bottom surface 330a2 of the plate portion 330a may extend across most of the plate portion 330a between the sidewall portions 330b and contact the TIM film 140.

The package lid 330 may include the bottom step region 130c that may project from the bottom surface 330a2 of the plate portion 330a. The bottom step region 330c may be formed around an entire perimeter of the central region 330a1 of the plate portion 330a.

The TIM film 140 may contact the bottom surface 330a2 of the plate portion 330a in the central region 330a1 of the plate portion 330a, and may be compressed between the bottom surface 330a2 and the upper surface of the interposer module 120. The degree of compression on the TIM film 140 between the bottom step region 130c and the interposer module 120 may be greater than the degree of compression on the TIM film 140 by the bottom surface 330a2 of the plate portion 330a and the interposer module 120. Thus, as illustrated in FIG. 3A, a compressed thickness of the TIM film 140 between the bottom step region 130c and the interposer module 120 may be less than the compressed thickness of the TIM film 140 between the bottom surface 330a2 of the plate portion 330a in the central region 330a1 and the interposer module 120.

Similar to the package lid 130 and package lid 230, the package lid 330 may have a square shape or rectangle shape in a horizontal cross-sectional view. Other suitable shapes of the package lid 330 may be within the contemplated scope of disclosure. The sidewall portion 330b may be formed around the entire perimeter of the plate portion 330a of the package lid 330, and the bottom step region 130c may be formed in the plate portion 330a around an entire perimeter of the TIM film 140. The TIM film 140 may also have a shape that corresponds to (e.g., is substantially the same as) the shape of the bottom step region 130c (i.e., a square shape) and may or may not correspond to a shape of the package lid 330.

The package lid 330 may also include the upper step region 230c that may project from the upper surface 330a3 of the plate portion 330a. The upper step region 230c may be formed around an entire perimeter of the central region 330a1 of the plate portion 330a. As illustrated in FIG. 3A, an innermost wall of the upper step region 230c that is formed at the central region 330a1 of the plate portion 330a, may be aligned with innermost wall of the bottom step region 230c that is formed at the central region 330a1 of the plate portion 330a. The upper step region 230c may be formed in the plate portion 330a of the package lid 330, for example, by milling using a computer numerical control (CNC) milling machine, or by molding or stamping the plate portion 330a of the package lid 330 to include the upper step region 230c.

A size of the TIM film 140 may be greater than a size of the upper surface 330a3 of the plate portion 330a (e.g., an upper surface 330a3 at the central region 330a1 of the plate portion 330a), so that the upper step region 230c may cover at least a portion of the TIM film 140. The upper step region 230c may be formed in the plate portion 330a around an entire perimeter of the TIM film 140. The TIM film 140 may also have a shape that corresponds to (e.g., is substantially the same as) the shape of the upper step region 230c and may or may not correspond to a shape of the package lid 330.

Figure 3B:
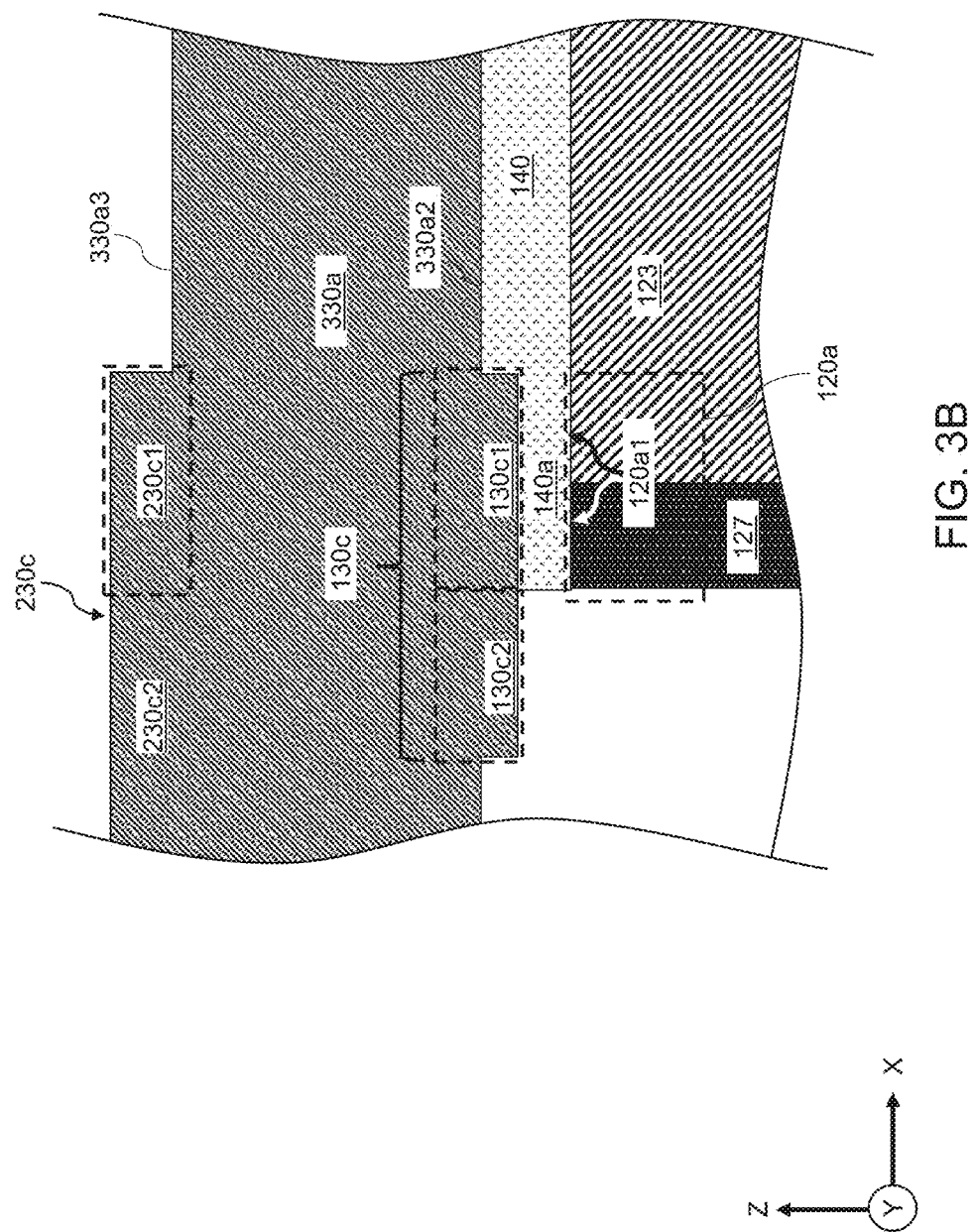
FIG. 3B provides a detailed vertical cross-sectional view of the bottom step region, the upper step region and the TIM film according to one or more embodiments.

FIG. 3B provides a detailed vertical cross-sectional view of the bottom step region 130c, the upper step region 230c and the TIM film 140 according to one or more embodiments. The upper step region 230c may or may not have substantially the same size and shape as the bottom step region 130c.

As illustrated in FIG. 3B, a width (e.g., in the x-direction) of the upper step region covering portion 230c1 may be substantially the same as a width (e.g., in the x-direction) of the bottom step region covering portion 130c1. The upper step region covering portion 230c1 may also be substantially aligned (e.g., in the z-direction) with the bottom step region covering portion 130c1. Further, the upper step region covering portion 230c1 and bottom step region covering portion 130c1 may be substantially aligned with the interposer module edge region 120a.

Alternatively, the width of the upper step region covering portion 230c1 may be different than the width of the bottom step region covering portion 130c1. In at least one embodiment, the width of the upper step region covering portion 230c1 may be less than the width of the bottom step region covering portion 130c1. In at least one embodiment, the width of the upper step region covering portion 230c1 may be in a range from 50% to 90% of the width of the bottom step region covering portion 130c1. In at least one embodiment, the width of the bottom step region covering portion 130c1 may be in a range from 50% to 90% of the width of the upper step region covering portion 230c1.

The upper step region non-covering portion 230c2 may have a width (e.g., in the x-direction) that is greater than a width (e.g., in the x-direction) of the bottom step region non-covering portion 130c2. That is, the upper step region non-covering portion 230c2 may extend farther in the x-direction than the bottom step region non-covering portion 130c2.

Figure 3C:
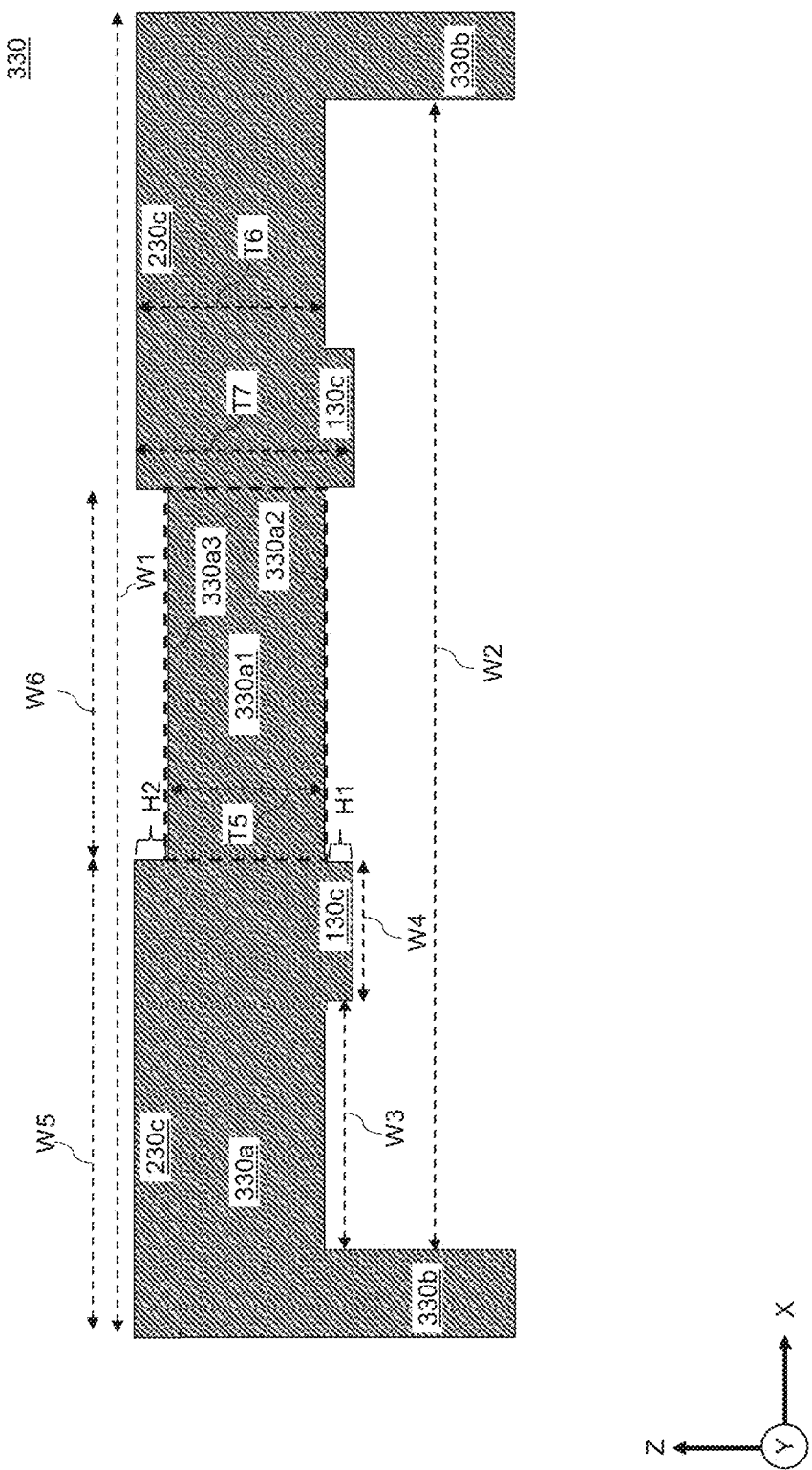
FIG. 3C illustrates a vertical cross-sectional view of a detailed illustration of the package lid according to one or more embodiments.

FIG. 3C provides a detailed illustration of the package lid 330 according to one or more embodiments. As illustrated in FIG. 3C, the package lid 330 may include the outer width W1 that extends across the plate portion 330a to an outermost edge of the sidewall portion 330b, the inner width W2 that may extend between the innermost edge of the sidewall portion 330b, the width W3 that extends from the innermost edge of the sidewall portion 330b to the bottom step region 130c, the width W4 that may be less than one-half of the W3 (W4<0.5W2), the width W5 of the upper step region 230c that may be less than one-half of the outer width W1 (W5<0.5W1), and the width W6 of the central region 330a1 that may be equal to the inner width W2 less twice the width of the bottom step region 130c and twice the width W3 (W6=W2−(2W4+2W3)) and equal to the outer width W1 less twice the width W5 of the upper step region 230c (W6=W1−2W5). The center of the TIM film 140 in the x-direction may be aligned with a center of the central region 330a1. Thus, the width W6 of the central region 330a1 may be less than a width of the TIM film 140 so that at least a portion of the bottom step region 130c (e.g., the bottom step region covering portion 130c1) and at least a portion of the upper step region 230c (e.g., the upper step region covering portion 230c1) may cover the TIM film edge region 140a.

The bottom step region 130c may have a height H1 that may be greater than or equal to zero (H1≥0) and the upper step region 230c may have a height H2 that may be greater than or equal to zero (H2≥0). Further, the height H1 of the bottom step region 130c may the same or different than the height H2 of the upper step region 230c. In one or more embodiments, the values of H1 and H2 may be in the following ranges: 0<H1≤0.1 mm and 0<H2≤0.5 mm.

The plate portion 330a may include a thickness T5 (e.g., in the z-direction) at the central region 330a1 of the plate portion 330a, a thickness T6 (e.g., in the z-direction) extending between the bottom surface 330a2 of the plate portion 330a and the upper surface of the upper step region 230c, and a thickness T7 (e.g., in the z-direction) extending from a surface of the bottom step region 130c to a surface of the upper step region 230c. The thickness T6 may be greater than the thickness T5 and less than the thickness T7 (T5<T6<T7). The increased thickness provided by the upper step region 230c may provide an increased rigidity to the package lid 330, and may allow for a greater force to be applied on the package lid 330 during assembly, and for a greater compression force to be applied by the package lid 330 to the TIM film edge region 140a.

FIGS. 4A-4F illustrate various intermediate structures that may be formed during a method of making the package assembly 100 according to one or more embodiments. The method in FIGS. 4A-4F may be substantially the same as the method used to form the package assembly 200 and the package assembly 300.

Figure 4A:
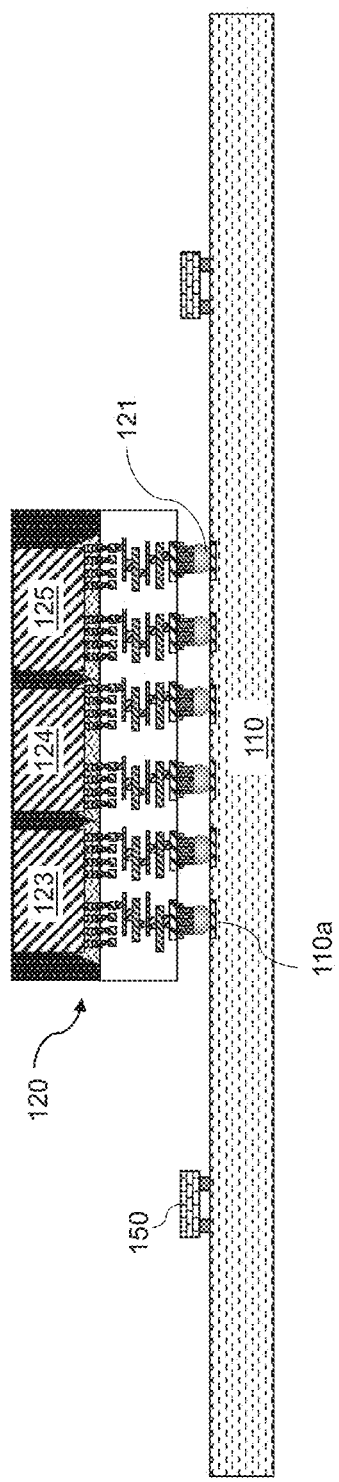
FIG. 4A illustrates a vertical cross-sectional view of an intermediate structure in which the interposer module may be mounted on the package substrate (e.g., via a flip chip bonding (FCB) bonding process) according to one or more embodiments.

FIG. 4A illustrates a vertical cross-sectional view of an intermediate structure in which the interposer module 120 may be mounted on the package substrate 110 (e.g., via a flip chip bonding (FCB) process) according to one or more embodiments. As illustrated in FIG. 4A, the C4 bumps 121 of the interposer module 120 may be positioned on the metal bonding pads 110a of the package substrate 110 and heated in order to bond the C4 bumps 121 to the metal bonding pads 110a.

Figure 4B:
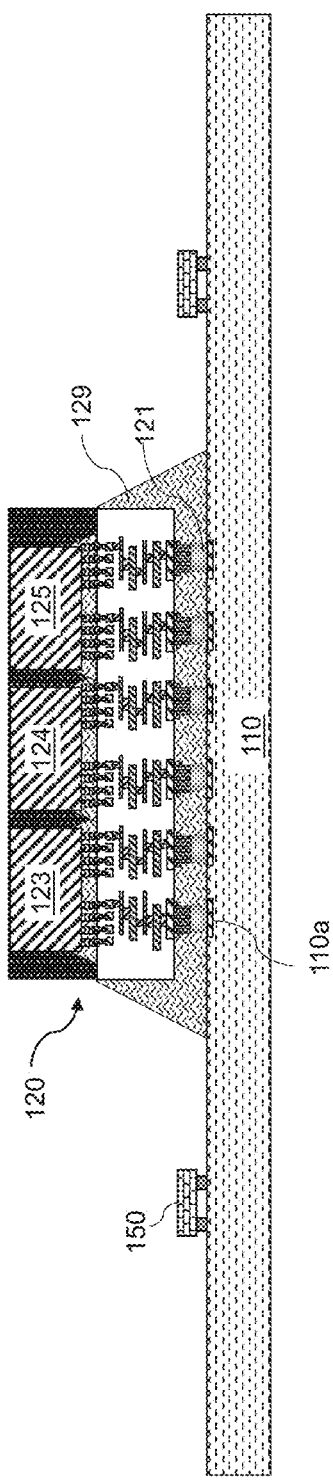
FIG. 4B illustrates a vertical cross-sectional view of an intermediate structure in which the package underfill layer may be formed on the package substrate according to one or more embodiments.

FIG. 4B illustrates a vertical cross-sectional view of an intermediate structure in which the package underfill layer 129 may be formed on the package substrate 110 according to one or more embodiments. The package underfill layer 129 may be formed of an epoxy-based polymeric material. As illustrated in FIG. 4B, the package underfill layer 129 may be formed under and around the interposer module 120 and the C4 bumps 121 so as to fix the interposer module 120 to the package substrate 110. The package underfill layer 129 may then be cured, for example, in a box oven for about 90 minutes at about 150° C. to provide the package underfill layer 129 with a sufficient stiffness and mechanical strength.

Figure 4C:
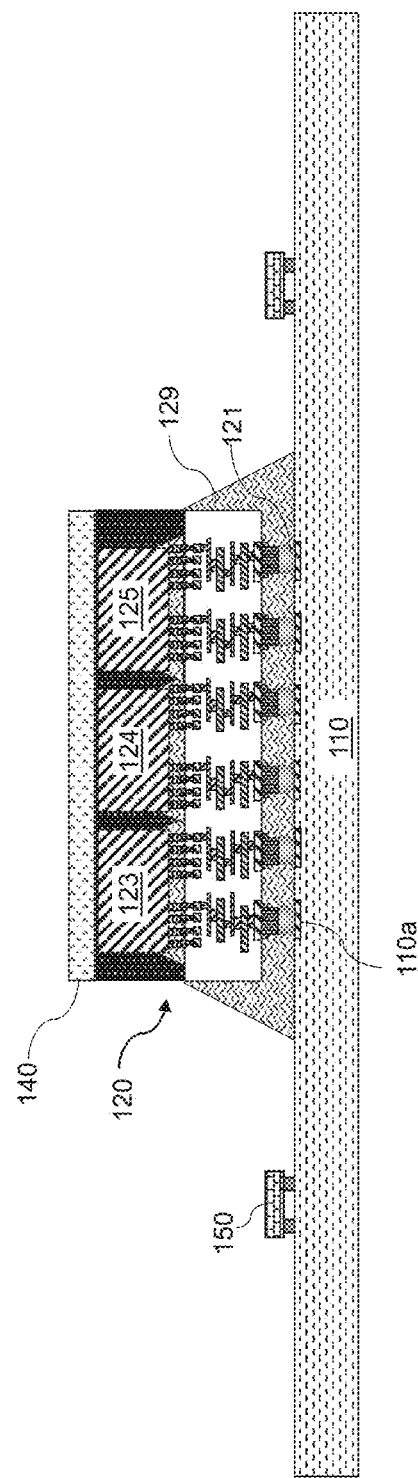
FIG. 4C illustrates a vertical cross-sectional view of an intermediate structure in which the TIM film may be attached to the upper surface of the interposer module according to one or more embodiments.

FIG. 4C illustrates a vertical cross-sectional view of an intermediate structure in which the TIM film 140 may be attached to the upper surface of the interposer module 120 according to one or more embodiments. The TIM film 140 may include, for example, a graphite TIM film or carbon nanotube (CNT) TIM film. The TIM film 140 may be attached to the upper surface of the interposer module 120 by using, for example, a thermally conductive adhesive.

Figure 4D:
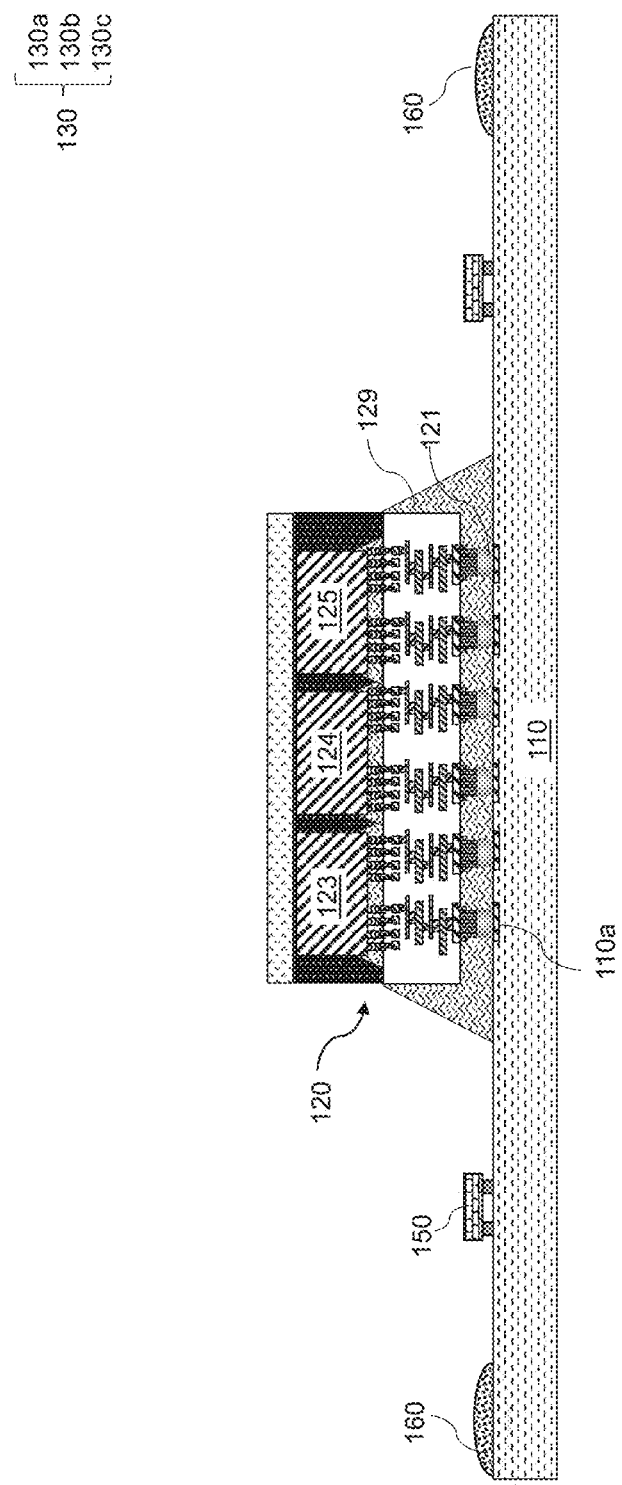
FIG. 4D illustrates a vertical cross-sectional view of an intermediate structure in which the adhesive may be applied to the package substrate according to one or more embodiments.

FIG. 4D illustrates a vertical cross-sectional view of an intermediate structure in which the adhesive 160 may be applied to the package substrate 110 according to one or more embodiments. The adhesive may include, for example, a silicone adhesive or an epoxy adhesive. The adhesive may be located on the package substrate 110 at a position corresponding to a placement of the sidewall portions 130b of the package lid 130, and in a quantity sufficient to securely bond the package lid 130 to the package substrate 110.

Figure 4E:
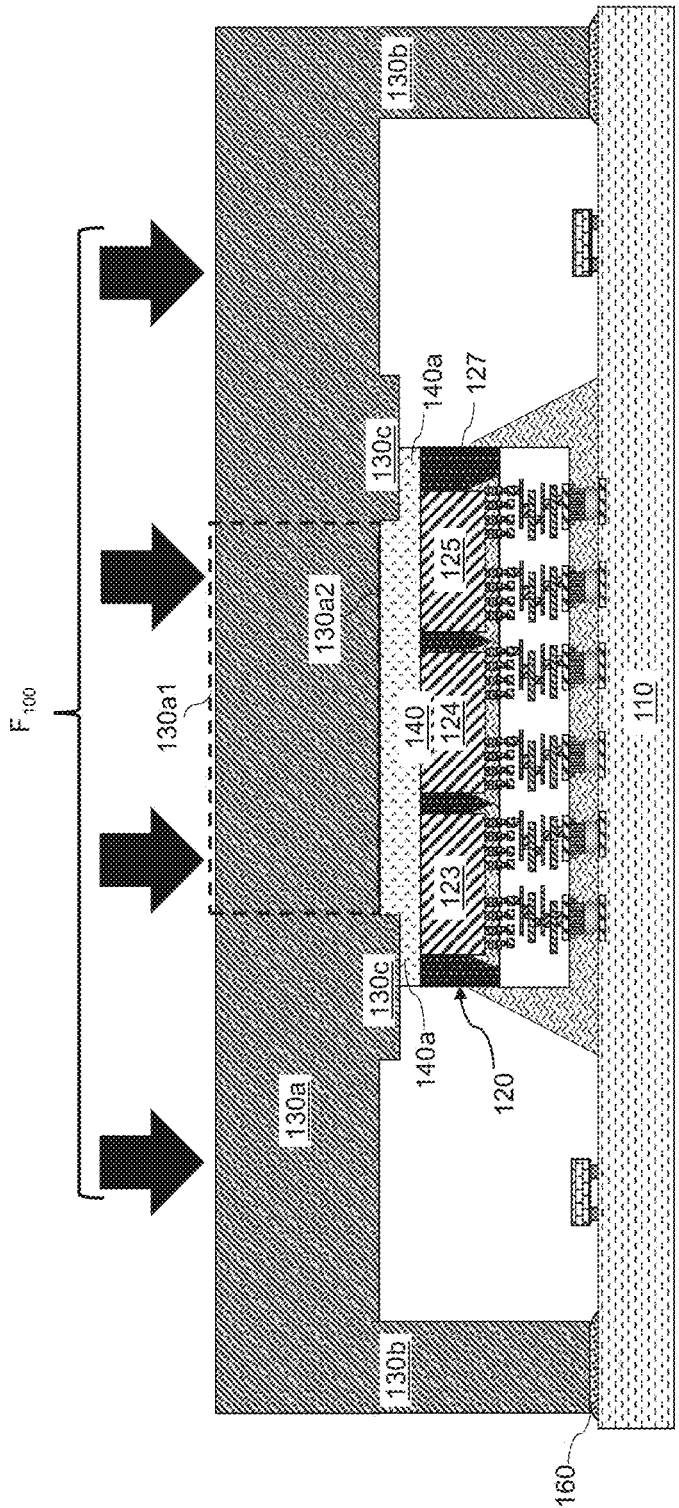
FIG. 4E illustrates a vertical cross-sectional view of an intermediate structure in which the package lid may be attached to (e.g., mounted on) the package substrate according to one or more embodiments.

FIG. 4E illustrates a vertical cross-sectional view of an intermediate structure in which the package lid 130 may be attached to (e.g., mounted on) the package substrate 110 according to one or more embodiments. As noted above, the package lid 130 may be composed of metal, ceramic or plastic and may be formed, for example, by milling using a computer numerical control (CNC) milling machine, or by molding or stamping the package lid 130 to include the bottom step region 130c.

In FIG. 4E, the package substrate 110 with the interposer module 120 may be placed on a surface and the package lid 130 lowered down over the interposer module 120 and onto the package substrate 110. The sidewall portion 130b of the package lid 130 may then be aligned with the adhesive 160 formed on the package substrate 110. The package lid 130 may then be pressed downward by applying a pressing force $F_{100}$ down onto the package lid 130 so that the sidewall portion 130b of the package lid 130 may contact the package substrate 110 through the adhesive 160.

Alternatively, the package lid 130 may be inverted (e.g., flipped) and placed on a surface (e.g., a flat surface), and the interposer module 120 on the package substrate 110 may be inverted and inserted into the package lid 130. The package substrate 110 and interposer module 120 may then be pressed by applying a pressing force down into the package lid 130 so that the sidewall portion 130b of the package lid 130 may contact the package substrate 110 through the adhesive 160.

In instances in which the package lid 130 may be applied onto the package substrate 110, the bottom step region 130 may contact the TIM film 140 before the bottom surface 130a2 of the plate portion 130a. The pressing force $F_{100}$ may cause the TIM film edge region 140a to be compressed (e.g., deformed) between the bottom step region 130c of the package lid 130 and the upper surface of the interposer module 120 (e.g., the upper surface 127a of the molding material layer 127). Because of the bottom step region 130c, even if the pressing force $F_{100}$ is applied uniformly over the upper surface of the plate portion 130a, the force applied by the package lid 130 to the TIM film edge region 140a may be greater than the force applied by the package lid 130 to the TIM film 140 outside of the TIM film edge region 140a. The TIM film edge region 140a may be compressed around the entire perimeter of the TIM film 140 by the bottom step region 130c which may inhibit the TIM film edge region 140a from delaminating (e.g., detaching) from the surface of the interposer module 120.

The pressing force $F_{100}$ may continue to be applied so that the bottom surface 130a2 at the central region 130a1 of the plate portion 130a may contact the TIM film 140. The pressing force $F_{100}$ may cause the TIM film 140 to be compressed by the bottom surface 130a2 of the package lid 130, but a compression of the TIM film 140 by the bottom surface 130a2 may be less than a compression of the TIM film edge region 140a by the step region 130c. A length of the sidewall portion 130b of the package lid 130 and a height H1 of the bottom step region 130c may be set so as to ensure that the pressing force $F_{100}$ may cause sufficient compression of the TIM film 140 and ensure that the TIM film edge region 140a will not detach from the upper surface of the interposer module 120.

The package lid 130 may be clamped to the package substrate 110 for a period to allow the adhesive 160 to cure and form a secure bond between the package substrate 110 and the package lid 130. The clamping of the package lid 130 to the package substrate 110 may be performed, for example, by using a heat clamp module. The heat clamp module may apply a uniform force across the upper surface of the package lid 130. In one or more embodiments, the heat clamp module may apply the pressing force $F_{100}$ to the package lid 130. Each of the downward arrows in FIG. 4E may represent a level of the force $F_{100}$ applied on the upper surface of the package lid 130 (e.g., a level of pressure applied from top to bottom in FIG. 4E) such as by a heat clamping module.

Figure 4F:
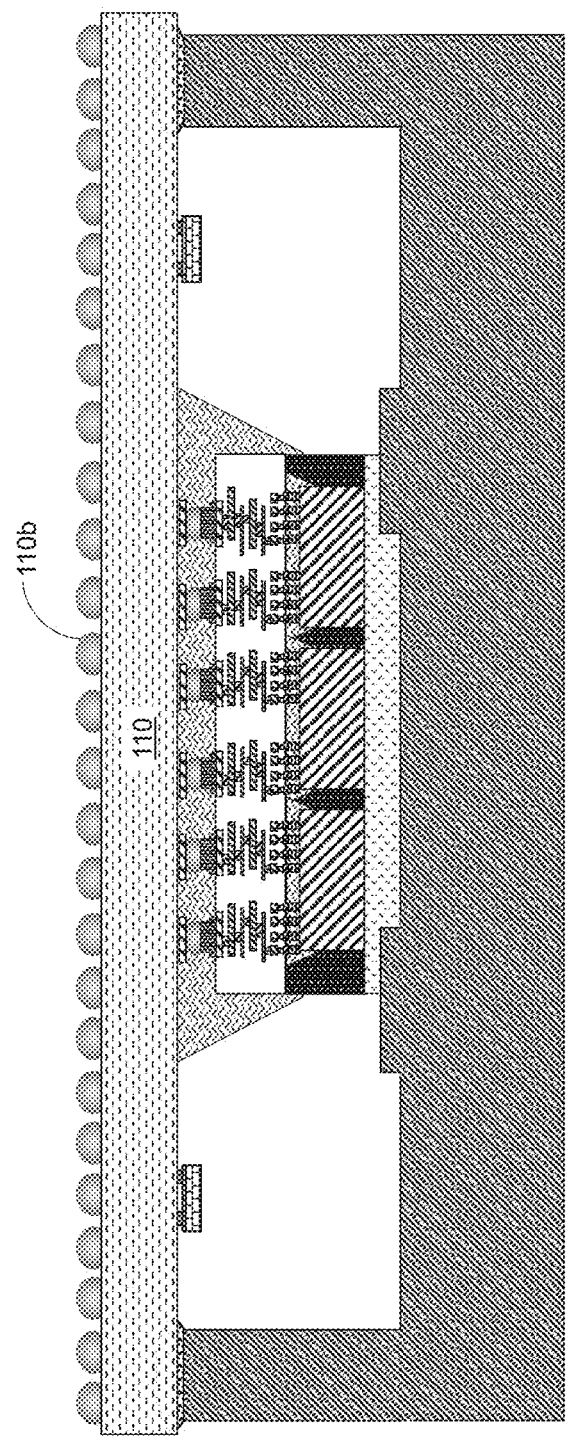
FIG. 4F illustrates a vertical cross-sectional view of an intermediate structure in which a plurality of solder balls may be formed on the package substrate according to one or more embodiments.

FIG. 4F illustrates a vertical cross-sectional view of an intermediate structure in which a plurality of solder balls 110b may be formed on the package substrate 110 according to one or more embodiments. The plurality of solder balls 110b may constitute a ball-grid array (BGA) that may allow the package assembly 100 to be securely mounted (e.g., by surface mount technology (SMT)) on a substrate such as a printed circuit board and electrically coupled to the substrate.

Figure 5B:
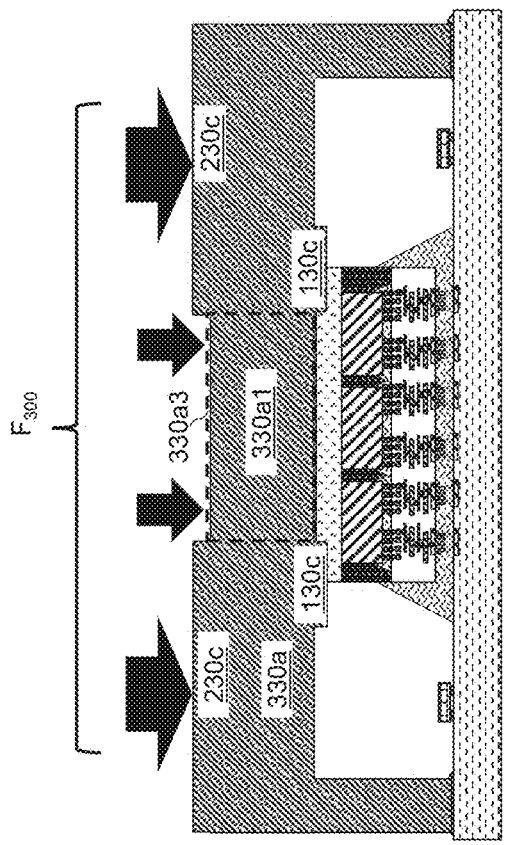
FIG. 5B illustrates a vertical cross-sectional view of an intermediate structure in which a force may be applied to the package lid according to one or more embodiments.
Figure 5A:
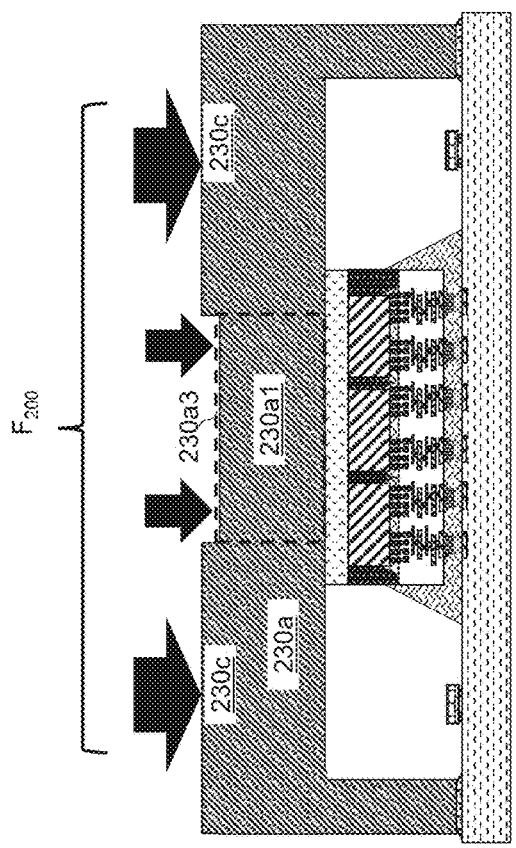
FIG. 5A illustrates a vertical cross-sectional view of an intermediate structure in which a force may be applied to the package lid according to one or more embodiments.

FIG. 5A illustrates a vertical cross-sectional view of an intermediate structure in which a pressing force $F_{200}$ may be applied to the package lid 230 according to one or more embodiments, and FIG. 5B illustrates a vertical cross-sectional view of an intermediate structure in which a pressing force $F_{300}$ may be applied to the package lid 330 according to one or more embodiments.

As illustrated in FIG. 5A, the pressing force $F_{200}$ (e.g., a level of the pressing force) may be applied non-uniformly so that the pressing force is greater on a surface of the upper step region 230c than the pressing force on the upper surface 230a3 of the plate portion 230a. The thickness of the plate portion 230a of the package lid 200 at the upper step region 230c may be greater than a thickness of the central region 230a1 of the plate portion 230a. The configuration of the package lid 200 may result in a plate portion 230a that is more rigid at the upper step region 230c and may allow for the greater force to be applied. In one or more embodiments, the pressing force $F_{200}$ may be applied to the package lid 230 in instances of attaching the package lid 230 to the package substrate 110, and/or when clamping the package assembly 200 together by a heat clamp module. Each of the downward arrows in FIG. 5A may represent a level of the force $F_{200}$ applied on the upper surface of the package lid 230 (e.g., a level of pressure applied from top to bottom in FIG. 5A) such as by a heat clamping module.

As illustrated in FIG. 5B, the pressing force F300 (e.g., a level of the pressing force) may be applied non-uniformly so that the pressing force may be greater on a surface of the upper step region 230c than the pressing force on the upper surface 230a3 of the plate portion 230a. The thickness of the plate portion 230a at the upper step region 230c may be greater than a thickness of the central region 230a1 of the plate portion 230a. In particular, the thickness of the plate portion 230a from the bottom step region 130c to the upper step region 230c may be greater than a thickness of the central region 230a1 of the plate portion 230a. The configuration of the package lid 200 may result in the plate portion 230a being more rigid at the upper step region 230c and the bottom step region 130c and allow for the greater force to be applied. In one or more embodiments, the pressing force F300 may be applied to the package lid 330 when attaching the package lid 330 to the package substrate 110, and/or when clamping the package assembly 300 together by a heat clamp module. Each of the downward arrows in FIG. 5B may represent a level of the force F300 applied on the upper surface of the package lid 330 (e.g., a level of pressure applied from top to bottom in FIG. 5B) such as by a heat clamping module. Thus, as illustrated by the arrows in FIGS. 5A-5B, the force F200 that may be applied by a heat clamping module on the package lid 230 in FIG. 5A, may be substantially the same (e.g., same magnitude) as the force F300 that may be applied by a heat clamping module on the package lid 330 in FIG. 5B.

Figure 6:
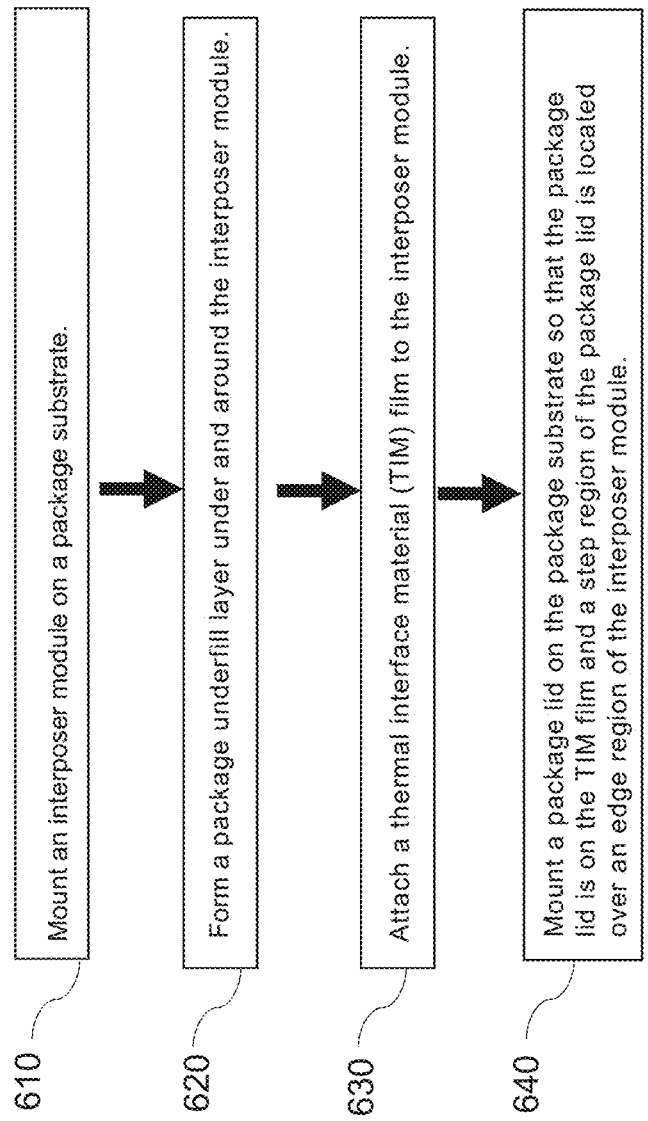
FIG. 6 is a flow chart illustrating a method of making a package assembly according to one or more embodiments.

FIG. 6 is a flow chart illustrating a method of making a package assembly according to one or more embodiments. Step 610 includes mounting an interposer module on a package substrate. Step 620 includes forming a package underfill layer under and around the interposer module. Step 630 includes attaching a thermal interface material (TIM) film to the interposer module. Step 640 includes mounting a package lid on the package substrate so that the package lid is on the TIM film and a step region of the package lid is located over an edge region of the interposer module.

Referring to FIGS. 1-6, a package assembly 100, 200, 300 may include an interposer module 120 on a package substrate 110, a thermal interface material (TIM) film on the interposer module 120, and a package lid 130, 230, 330 that may include a plate portion 130a, 230a, 330a on the TIM film 140 and a step region 130c, 230c projecting away from the plate portion 130a, 230a, 330a and located over the TIM film 140 and over an edge region 120a of the interposer module 120.

The plate portion 130a, 230a, 330a may include a central region 130a1, 230a1, 330a1 located over a central portion of the interposer module 120, and the step region 130c, 230c may project away from the plate portion 130a, 230a, 330a outside of the central region 130a1, 230a1, 330a1. The step region 130c, 230c may include a bottom step region 130c that may be on a bottom surface of the plate portion 130a, 230a, 330a, and may project from the bottom surface in a first direction toward the interposer module 120. The step region 130c, 230c may include an upper step region 230c that may be on an upper surface of the plate portion 130a, 230a, 330a, and may project from the upper surface in a first direction away from the interposer module 120. The step region 130c, 230c may include a bottom step region 130c that may be on a bottom surface of the plate portion 130a, 230a, 330a, and may project from the bottom surface in a first direction toward the interposer module 120, and an upper step region 230c that may be on an upper surface of the plate portion 130a, 230a, 330a, and may project from the upper surface in a first direction away from the interposer module 120. An edge of the bottom step region 130c and an edge of the upper step region 230c may be substantially aligned in the first direction. The TIM film 140 may include one of a graphite TIM film 140 and a carbon nanotube TIM film 140. The TIM film 140 may include a TIM film edge region 140a that covers the edge region of the interposer module 120, and the TIM film edge region 140a may be compressed between the step region 130c, 230c of the package lid 130, 230, 330 and the edge region of the interposer module 120. The TIM film edge region 140a may be formed around an entire perimeter of the TIM film 140, and the edge region of the TIM film 140 may be compressed between the step region 130c, 230c of the package lid 130, 230, 330 and the edge region of the interposer module 120 around the entire perimeter of the TIM film 140. The interposer module 120 may include an interposer dielectric layer and a plurality of semiconductor dies located on the interposer dielectric layer. The interposer module 120 further may include a molding material layer formed on the plurality of semiconductor dies, and the edge region of the interposer module 120 may include the molding material layer 127. The step region 130c, 230c may include a bottom step region 130c including a bottom step region covering portion 130c1 that covers the edge region 120a of the interposer module 120 and a bottom step region non-covering portion 130c2 that does not cover the edge region 120a of the interposer module 120.

Referring again to FIGS. 1-6, a method of making a package assembly 100, 200, 300 may include mounting an interposer module 120 on a package substrate 110, attaching a thermal interface material (TIM) film to the interposer module 120, and mounting a package lid 130, 230, 330 on the package substrate 110 so that a plate portion 130a, 230a, 330a of the package lid 130, 230, 330 may be on the TIM film 140 and a step region 130c, 230c of the package lid 130, 230, 330 may project away from the plate portion 130a, 230a, 330a and may be located over the TIM film 140 and over an edge region 120a of the interposer module 120. The mounting of the package lid 130, 230, 330 on the package substrate 110 may include forming an adhesive on the package substrate 110, inserting the interposer module 120 into the package lid 130, 230, 330 so that the edge region of the interposer module 120 may be aligned with the step region 130c, 230c of the package lid 130, 230, 330, and connecting the package substrate 110 to the package lid 130, 230, 330 using the adhesive. The connecting of the package substrate 110 to the package lid 130, 230, 330 may include clamping together the package substrate 110 and the package lid 130, 230, 330 so as to press the step region 130c, 230c of the package lid 130, 230, 330 onto the TIM film 140 over the edge region of the interposer module 120. The TIM film 140 may include a TIM film edge region 140a that may be on the edge region of the interposer module 120, and the mounting of the package lid 130, 230, 330 on the package substrate 110 may include compressing the TIM film edge region 140a between the step region 130c, 230c of the package lid 130, 230, 330 and the edge region of the interposer module 120. The TIM film edge region 140a may be formed around an entire perimeter of the TIM film 140, and the mounting of the package lid 130, 230, 330 on the package substrate 110 may include compressing the TIM film edge region 140a between the step region 130c, 230c of the package lid 130, 230, 330 and the edge region of the interposer module 120 around the entire perimeter of the TIM film 140. The interposer module 120 may include an interposer dielectric layer, a plurality of semiconductor dies on the interposer dielectric layer, and a molding material layer on the plurality of semiconductor dies, and the mounting of the package lid 130, 230, 330 on the package substrate 110 may include compressing the TIM film edge region 140a between the step region 130c, 230c of the package lid 130, 230, 330 and the molding material layer.

Referring again to FIGS. 1-6, a package assembly 100, 200, 300 may include an interposer module 120 on a package substrate 110. The interposer module 120 may include an interposer dielectric layer, a plurality of semiconductor dies located on the interposer dielectric layer, and a molding material layer formed on the plurality of semiconductor dies. The package assembly 100, 200, 300 may further include a thermal interface material (TIM) film 140 on the interposer module 120, the TIM film 140 comprising one of a graphite TIM film 140 and a carbon nanotube TIM film 140, and a package lid 130, 230, 330 that may be on the TIM film 140. The package lid 130, 230, 330 may include a plate portion 130a, 230a, 330a located over a central portion of the interposer module 120, and a step region 130c, 230c projecting from the plate portion 130a, 230a, 330a and located over the TIM film 140 and over an edge region of the interposer module 120. The step region 130c, 230c may include at least one of a bottom step region 130c that may be on a bottom surface of the package lid 130, 230, 330 and may project from the plate portion 130a, 230a, 330a in a first direction toward the interposer module 120, and an upper step region 230c that may be on an upper surface of the package lid 130, 230, 330 and may project from the plate portion 130a, 230a, 330a in the first direction away from the interposer module 120. The TIM film 140 may include a TIM film edge region 140a that may be on the edge region of the interposer module 120, and the TIM film edge region 140a may be compressed between the step region 130c, 230c of the package lid 130, 230, 330 and the edge region of the interposer module 120. The TIM film edge region 140a may be formed around an entire perimeter of the TIM film 140, and the TIM film edge region 140a may be compressed between the step region 130c, 230c of the package lid 130, 230, 330 and the edge region of the interposer module 120 around the entire perimeter of the TIM film 140.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package assembly, comprising:
   an interposer module including an edge region comprising a molding material layer on a package substrate;
   a thermal interface material (TIM) film on the interposer module; and
   a package lid comprising a plate portion on the TIM film, wherein the plate portion comprises:
   a central region over a central portion of the interposer module and having a width less than a width of an uppermost surface of the interposer module; and
   a step region located over the TIM film and over the edge region of the interposer module and extending laterally beyond an outer sidewall of the molding material layer, wherein the step region adjoins the central region around an entire periphery of the central region and a thickness of the plate portion at the step region is greater than a thickness of the plate portion at the central region.

2. The package assembly of claim 1, wherein a width of a portion of the step region over the edge region of the interposer module is greater than a width of a portion of the step region extending laterally beyond an outer sidewall of the molding material layer.

3. The package assembly of claim 2, wherein the step region comprises a bottom step region that is located on a bottom surface of the plate portion, and projects away from the bottom surface in a first direction toward the interposer module.

4. The package assembly of claim 2, wherein the step region comprises an upper step region that is located on an upper surface of the plate portion.

5. The package assembly of claim 2, wherein the step region comprises:
   a bottom step region that is located on a bottom surface of the plate portion, and projects away from the bottom surface in a first direction toward the interposer module; and
   an upper step region that is located on an upper surface of the plate portion, wherein an edge of the bottom step region and an edge of the upper step region are substantially aligned in the first direction.

6. The package assembly of claim 1, wherein the TIM film comprises a graphite TIM film.

7. The package assembly of claim 1, wherein the TIM film comprises a carbon nanotube TIM film.

8. The package assembly of claim 1, wherein the TIM film comprises a TIM film edge region that covers the edge region of the interposer module, and the TIM film edge region is compressed between the step region of the package lid and the edge region of the interposer module.

9. The package assembly of claim 8, wherein the TIM film edge region is formed around an entire perimeter of the TIM film, and the TIM film edge region is compressed between the step region of the package lid and the edge region of the interposer module around the entire perimeter of the TIM film.

10. The package assembly of claim 1, wherein the interposer module comprises an interposer dielectric layer and a plurality of semiconductor dies located on the interposer dielectric layer.

11. The package assembly of claim 10, wherein the molding material layer is formed on the plurality of semiconductor dies.

12. The package assembly of claim 1, wherein the step region comprises a bottom step region including a bottom step region covering portion that covers the edge region of the interposer module and a bottom step region non-covering portion that does not cover the edge region of the interposer module.

13. A package structure, comprising:
   a package substrate;
   an interposer module on the package substrate including a plurality of semiconductor devices and a molding material layer on the plurality of semiconductor devices; and
   a package lid on the interposer module including a plate portion comprising:

a central region over a central portion of the interposer module and having a width less than a width of an uppermost surface of the interposer module; and a step region projecting down from the plate portion over an edge region of the interposer module, wherein the step region extends laterally beyond an outer sidewall of the molding material layer, wherein the step region adjoins the central region around an entire periphery of the central region and a thickness of the plate portion at the step region is greater than a thickness of the plate portion at the central region.

14. The package structure of claim 13, wherein a width of a portion of the step region over the edge region of the interposer module is greater than a width of a portion of the step region extending laterally beyond an outer sidewall of the molding material layer.

15. The package structure of claim 14, wherein the width of the central region of the plate portion is greater than a width of the step region.

16. The package structure of claim 14, further comprising:
a thermal interface material (TIM) film on the interposer module, wherein the plate portion of the package lid is on the TIM film, and a center of the TIM film is aligned with a center of the central region of the plate portion.

17. The package structure of claim 16, wherein the height of the step region is less than a thickness of the TIM film.

18. The package structure of claim 17, wherein the height of the step region is less than 0.3 times the thickness of the TIM film.

19. A package structure, comprising:
a package substrate;
an interposer module on the package substrate including a plurality of semiconductor devices and a molding material layer on the plurality of semiconductor devices; and
a package lid, comprising:
a sidewall portion attached to the package substrate;
a plate portion on the sidewall portion, comprising:
a central region over a central portion of the interposer module and having a width less than a width of an uppermost surface of the interposer module; and
a frame-shaped step region projecting down from the plate portion over an edge region of the interposer module, wherein a width of the frame-shaped step region is less than a distance between the frame-shaped step region and the sidewall portion, the step region extends laterally beyond an outer sidewall of the molding material layer and adjoins the central region around an entire periphery of the central region, and a thickness of the plate portion at the step region is greater than a thickness of the plate portion at the central region.

20. The package structure of claim 19, wherein the width of the central region is greater than the distance between the frame-shaped step region and the sidewall portion.

* * * * *